(12) United States Patent
Kirkland et al.

(10) Patent No.: US 10,896,834 B2
(45) Date of Patent: Jan. 19, 2021

(54) WAFER SHIPPER WITH STACKED SUPPORT RINGS

(71) Applicant: ENTEGRIS, INC., Billerica, MA (US)

(72) Inventors: Eric A. Kirkland, Colorado Springs, CO (US); Russell V. Raschke, Chanhassen, MN (US)

(73) Assignee: ENTEGRIS, INC., Billerica, MA (US)

( * ) Notice: Subject to any disclaimer, the term of this patent is extended or adjusted under 35 U.S.C. 154(b) by 327 days.

(21) Appl. No.: 15/120,973

(22) PCT Filed: Feb. 24, 2015

(86) PCT No.: PCT/US2015/017345
§ 371 (c)(1),
(2) Date: Aug. 23, 2016

(87) PCT Pub. No.: WO2015/130690
PCT Pub. Date: Sep. 3, 2015

(65) Prior Publication Data
US 2016/0365265 A1 Dec. 15, 2016

Related U.S. Application Data

(60) Provisional application No. 62/089,103, filed on Dec. 8, 2014, provisional application No. 62/089,087, filed (Continued)

(51) Int. Cl.
*H01L 21/673* (2006.01)
*H01L 21/683* (2006.01)

(52) U.S. Cl.
CPC .. *H01L 21/67346* (2013.01); *H01L 21/67369* (2013.01); *H01L 21/67386* (2013.01); *H01L 21/6838* (2013.01)

(58) Field of Classification Search
CPC ......... H01L 21/67346; H01L 21/67369; H01L 21/67386; H01L 21/67366;
(Continued)

(56) References Cited

U.S. PATENT DOCUMENTS 5,551,572 A 9/1996 Nemoto
6,286,684 B1 9/2001 Brooks et al.
(Continued)

FOREIGN PATENT DOCUMENTS

CN 101888957 A 11/2010
JP S61291336 A 12/1986
(Continued)

*Primary Examiner* — Robert Poon
(74) *Attorney, Agent, or Firm* — Entegris, Inc.

(57) ABSTRACT

A wafer shipper utilizing wafer support rings for supporting individual wafers therein. The wafer support rings can support wafers of various thicknesses without affecting the height of the stack, and provide containment of the resident wafers within the rings during an impact event. The wafers and the rings cooperate to define voids between the wafers that act as cushions in an impact event for dampening the shock imparted on the wafers during an impact event. Likewise, some embodiments include structure that defines enclosed gas pockets between the uppermost and the lowermost wafers of the stack for dampening the effects of an impact. Various embodiments include structure that prevents wafers from "jumping" out of the wafer support rings during an impact event. Some embodiments include structure for supporting wafer flats.

13 Claims, 32 Drawing Sheets

Related U.S. Application Data on Dec. 8, 2014, provisional application No. 61/944,455, filed on Feb. 25, 2014.

(58) Field of Classification Search
CPC ......... H01L 21/67383; H01L 21/67396; H01L 21/67373; H01L 21/67379
USPC .................................................. 206/710–711
See application file for complete search history.

(56) References Cited

U.S. PATENT DOCUMENTS

| | | | |
|---|---|---|---|
| 6,550,619 | B2 | 4/2003 | Bores et al. |
| 7,040,487 | B2 | 5/2006 | Zabka et al. |
| 7,138,726 | B2 | 11/2006 | Amador et al. |
| 9,224,627 | B2 * | 12/2015 | Pylant ............... H01L 21/67369 |
| 2006/0144752 | A1 * | 7/2006 | Forsyth ............ H01L 21/67346 |
| | | | 206/710 |
| 2007/0284282 | A1 | 12/2007 | Yajima et al. |
| 2009/0127152 | A1 * | 5/2009 | Bou-Mezrag ...... B65D 21/0231 |
| | | | 206/507 |
| 2009/0250374 | A1 | 10/2009 | Kasama et al. |
| 2010/0224517 | A1 | 9/2010 | Haggard |
| 2014/0076774 | A1 * | 3/2014 | Kaashoek ......... H01L 21/67379 |
| | | | 206/711 |

FOREIGN PATENT DOCUMENTS

| | | |
|---|---|---|
| JP | H0872974 A | 3/1996 |
| JP | H1050815 A | 2/1998 |
| JP | 2004-207260 A | 7/2004 |
| JP | 2004241705 A | 8/2004 |
| JP | 2005191419 A | 7/2005 |
| JP | 3130509 U | 3/2007 |
| JP | 2008044636 A | 2/2008 |
| JP | 2009076646 A | 4/2009 |
| JP | 2009105116 A | 5/2009 |
| JP | 2012251214 A | 12/2012 |
| WO | 2007/092557 A2 | 8/2007 |
| WO | 2015/130690 A1 | 9/2015 |
| WO | 2016/094398 A1 | 6/2016 |

* cited by examiner

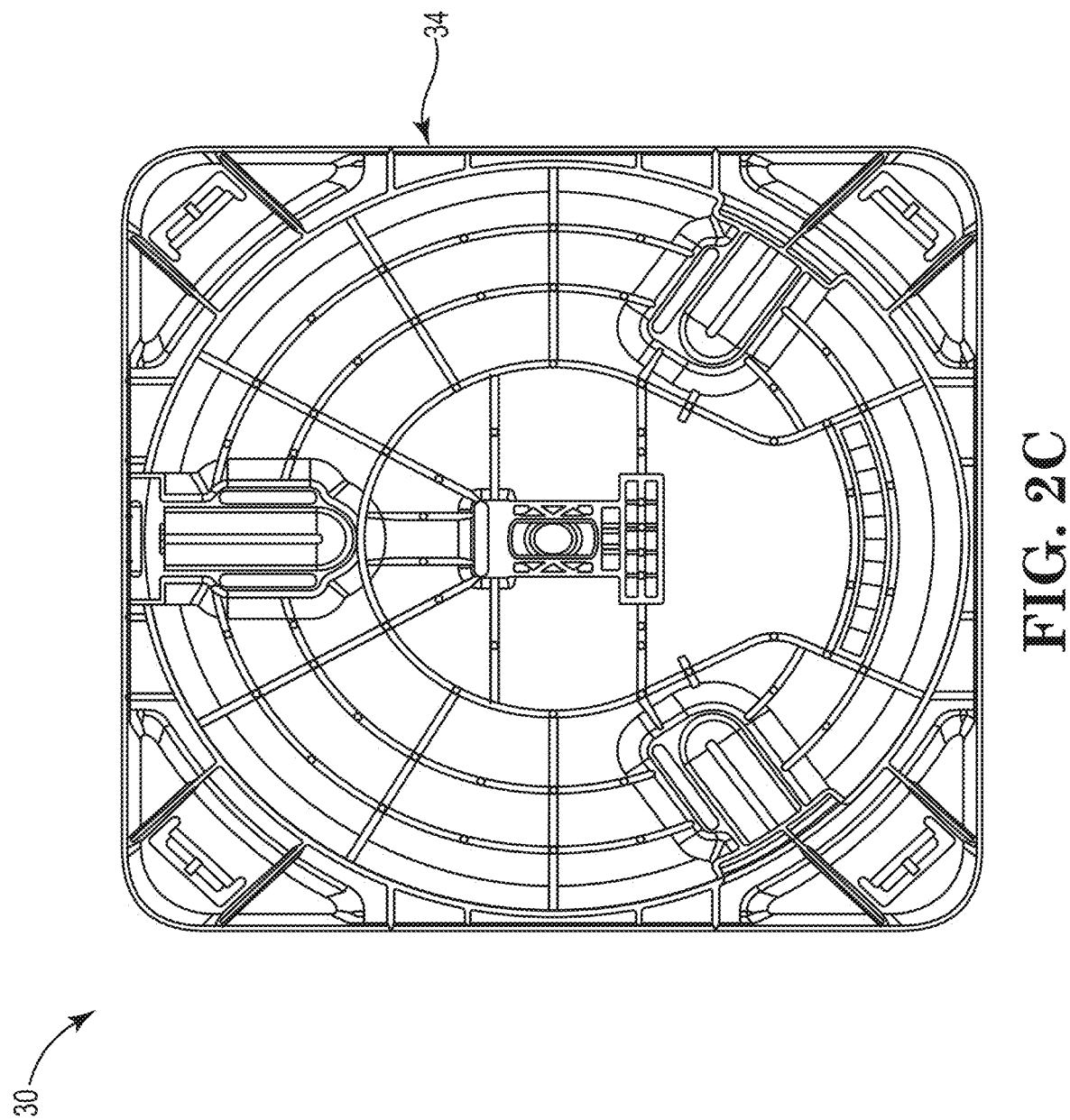

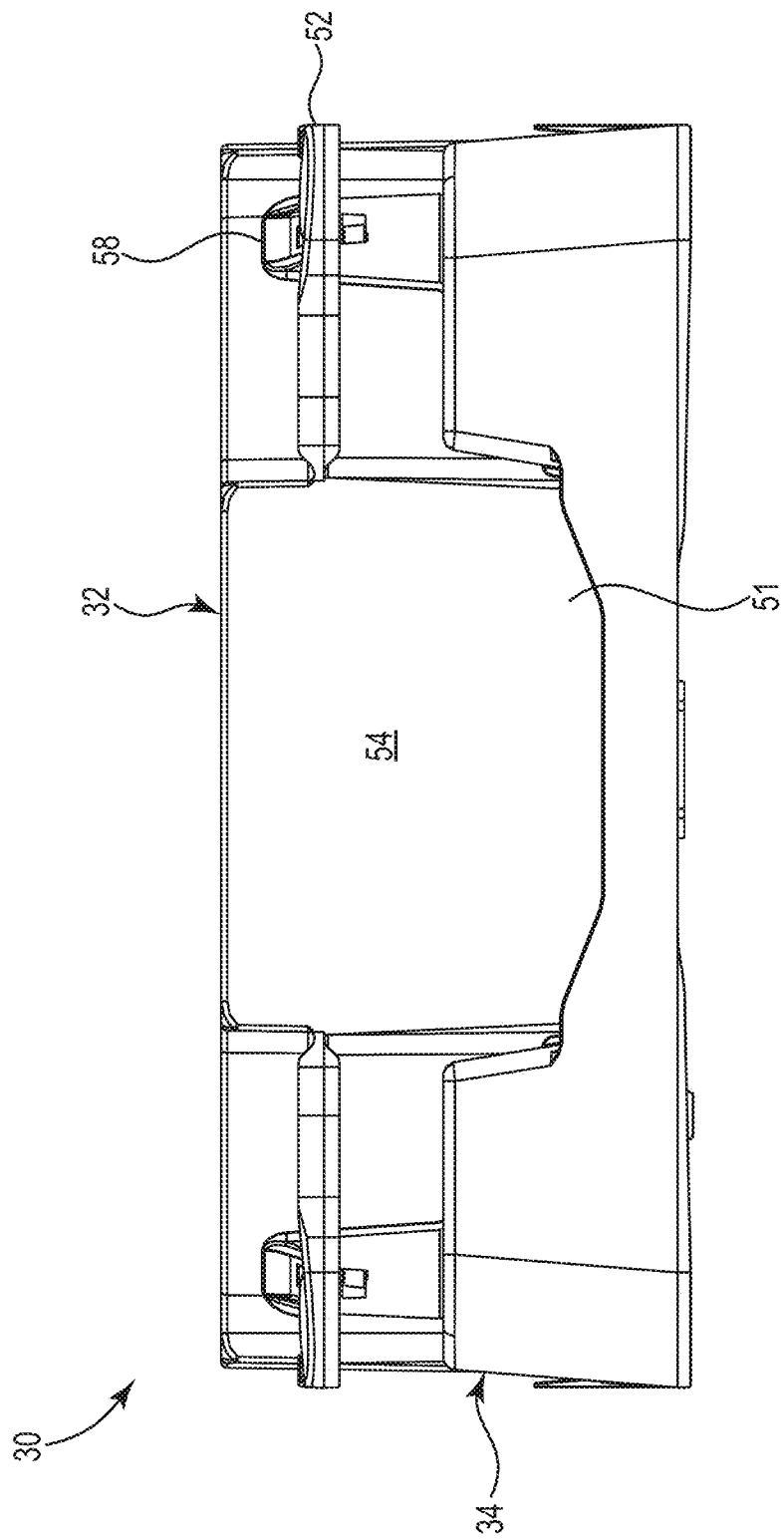

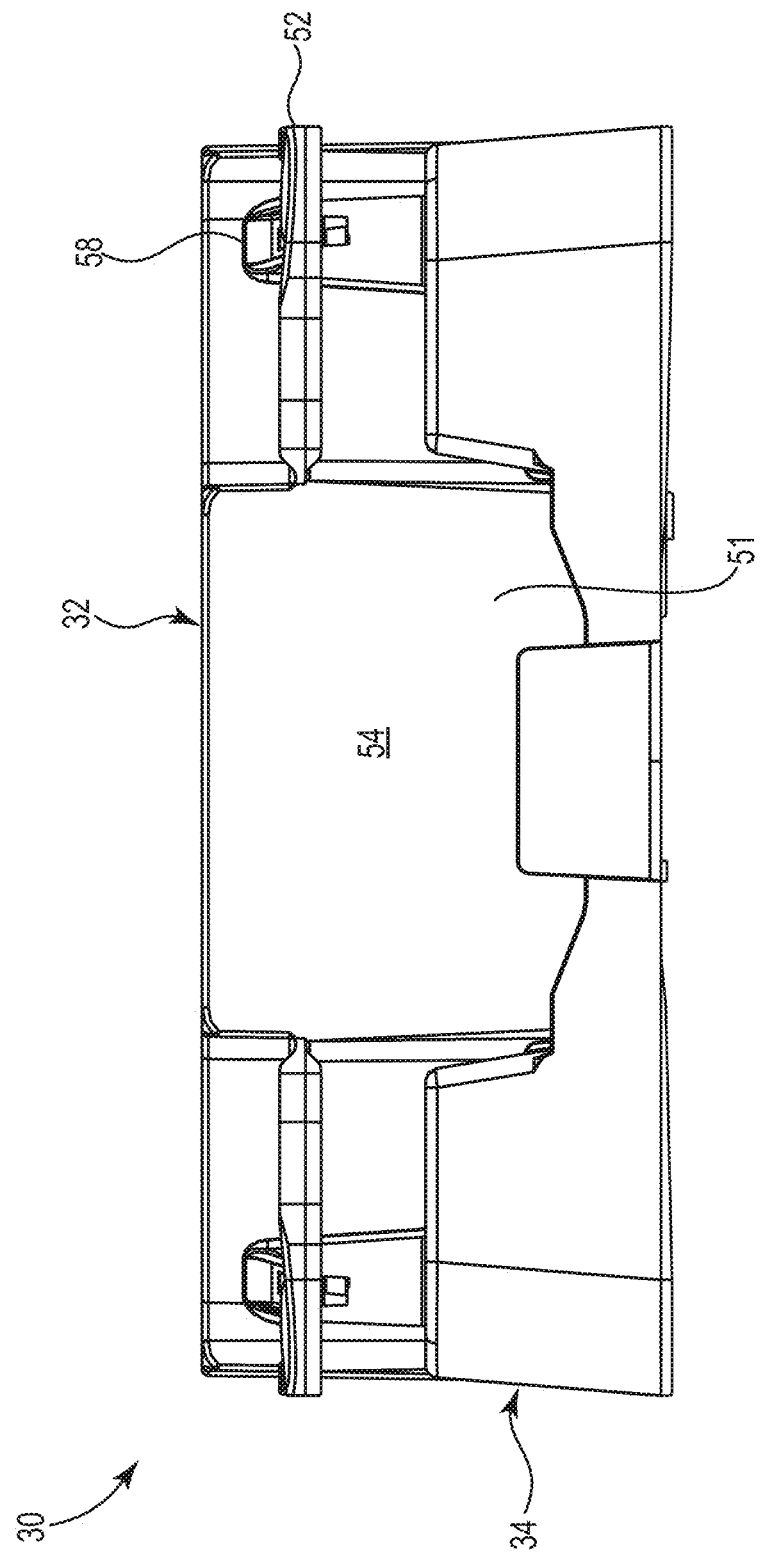

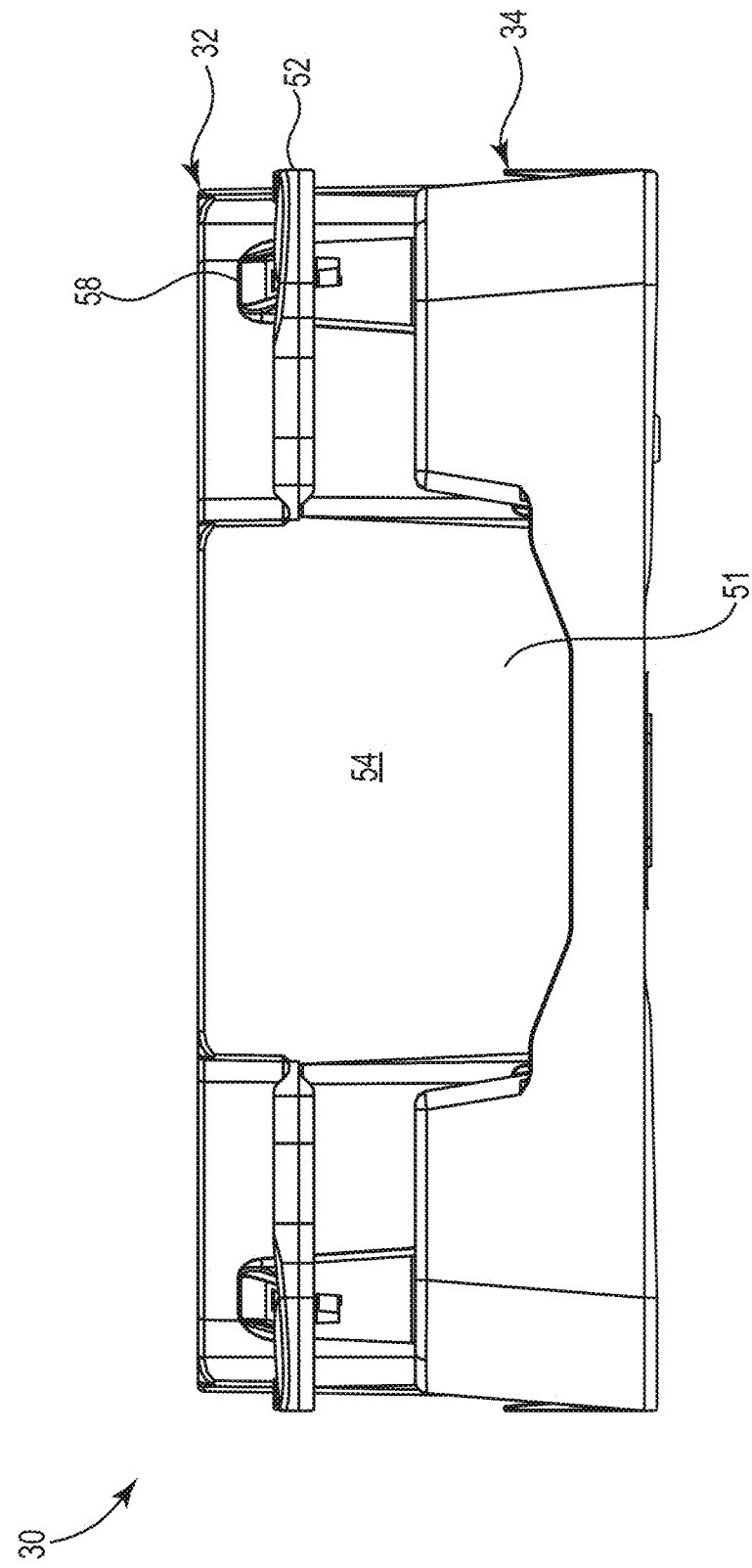

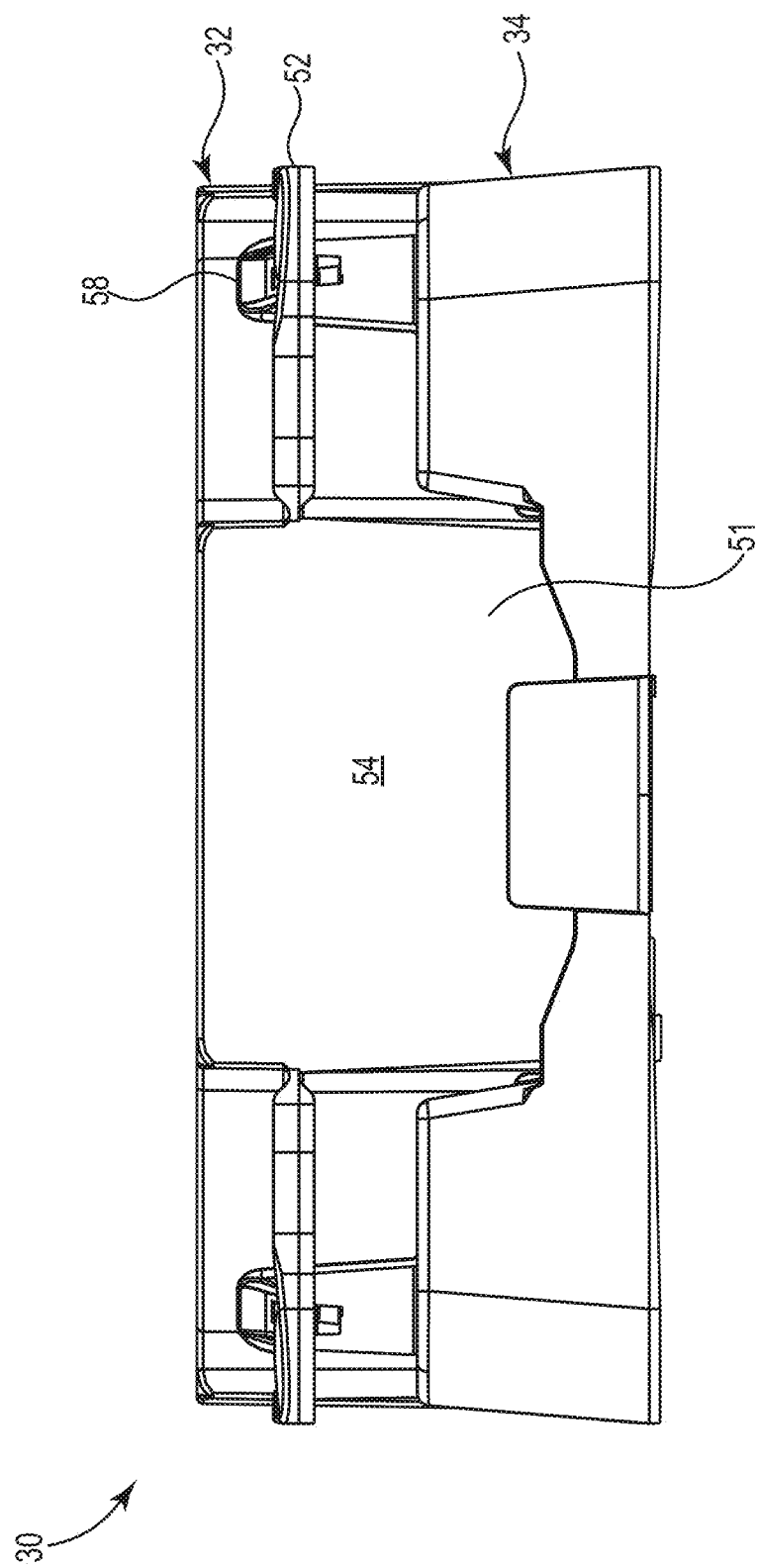

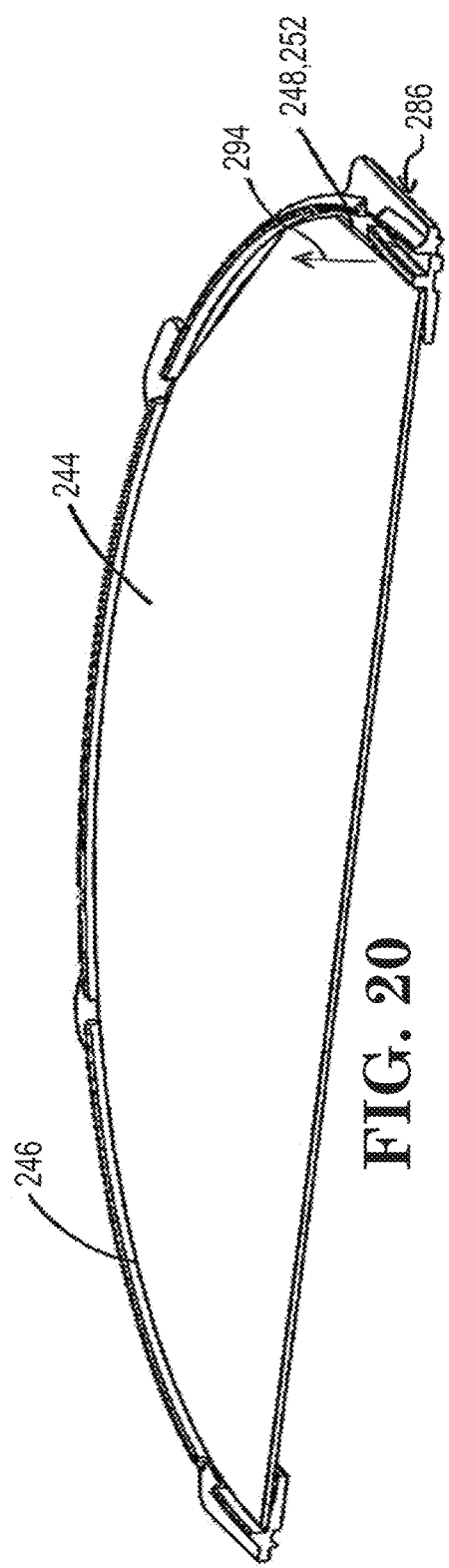
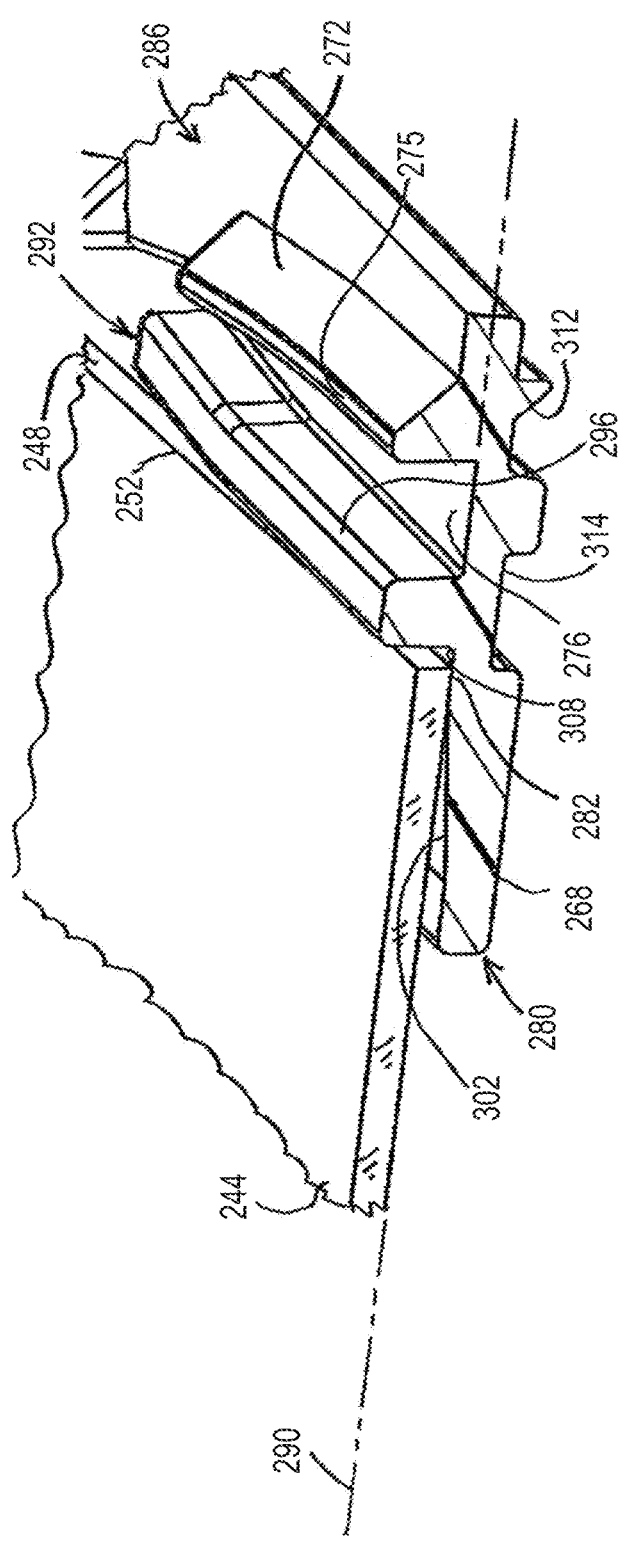
FIG. 20
FIG. 21

WAFER SHIPPER WITH STACKED SUPPORT RINGS

RELATED APPLICATIONS

This patent application is a National Phase entry of PCT Application No. PCT/US2015/017345, filed Feb. 24, 2015, which claims the benefit of U.S. Provisional Patent Application No. 61/944,455, filed Feb. 25, 2014, of U.S. Provisional Patent Application No. 62/089,087, filed December 8, 2014, and of U.S. Provisional Patent Application No. 62/089,103, filed Dec. 8, 2014, the disclosures of which are hereby incorporated by reference herein in their entirety and for all purposes.

FIELD OF THE DISCLOSURE

The disclosure relates generally to wafer shippers, and more specifically to wafer shippers utilizing wafer support rings.

BACKGROUND

Wafer shippers have been developed for transport and storage of a plurality of wafers, each disposed in a wafer support ring. The rings are arranged in a stacked arrangement within the wafer shipper. Wafers that are handled and shipped using conventional wafer shippers of this kind are known to incur damage imparted to the resident wafers during an impact event, such as when the wafer shipper is dropped from an appreciable height or when a vessel or crate within which the wafer shipper is contained is dropped, mishandled, or undergoes a collision. The mechanism for damage can include contact between adjacent wafers, wafers "jumping" the stacked array and becoming lodged between adjoining wafer support rings, and, for wafers including a wafer flat, fractures of the wafers originating at the wafer flat.

A wafer shipper that mitigates such damages that occur during transport and handling would be welcomed.

SUMMARY

In various embodiments of the disclosure, a wafer shipper utilizing wafer support rings for supporting individual wafers therein is disclosed. The wafer support rings can support wafers of various thicknesses without affecting the height of the stack, and provide containment of the resident wafers within the rings during an impact event. In some embodiments, the wafers and the rings cooperate to effectively define slow-leaking air cushions between the wafers that provide shock absorption of the wafers during an impact event. That is, when the stack is assembled with wafers therein, a void is defined between adjacent wafers, each void serving as a gas spring or cushion that causes the wafers to move in unison and dampens the forces incurred during a shock event. Substantially continuous bands of contact are defined at the interface of adjoining wafer support rings and between the wafer support ring and any wafer residing therein. The substantially continuous bands of contact provide a flow restriction for gas flowing into or out of the voids, thereby providing a dampening effect during the impact event.

In some embodiments, the uppermost wafer and uppermost wafer support ring cooperate with a cover portion of the wafer shipper to provide an upper gas pocket that, like the voids of the stack, is slow leaking and thus provides dampening against sudden compression or evacuation of the gas pocket. Likewise, the lowermost wafer and lowermost wafer support ring can cooperate with a receptacle portion of the wafer shipper to provide a lower gas pocket that is slow leaking and provides similar dampening.

In various embodiments, the wafer support rings also include structure that prevents "jumping" of the wafers during an impact event. Often, wafer shippers become momentarily distorted during an impact event, such that the support rings within the stack separate for an instant in time. During this separation, with conventional wafer carriers, wafers can slip or "jump" into the separation and become damaged when the stack resumes or attempts to resume the pre-impact configuration. For various embodiments of the disclosure, the wafer support rings provide structure that mitigates such jumping of the wafers, so that the stack can reliably resume the pre-impact configuration and without damage to the wafers.

Various embodiments of the disclosure provide the same shipping capacity regardless of wafer thickness, protects the edge exclusion of the wafer, and/or avoids particle contribution of conventional spacer rings (e.g., TYVEK, or foam). The disclosed embodiments can enable safe shipping of wafers and satisfy industry standard test specifications (ISTA-2A) as well as customer specific shipping tests that may be more stringent.

Conventional wafer shippers typically utilize ring spacers that fit between the wafers and do not capture the edge of the wafer. One disadvantage of such conventional shippers is that the edge exclusion of the wafer can be violated by a wafer sliding past the ring spacer. Another disadvantage is that the total stack height is dependent upon the thickness of the wafers being shipped. Thus, a given shipper may not be at full capacity for all wafer thicknesses, requiring extra mechanisms to make up for lower capacities. An additional shortcoming of these conventional wafer shippers is that the forces acting through the carrier (e.g., due to impact events) are transferred through the wafers in this type of solution. Also, where anti-static characteristics are desired, conventional spacer ring materials (e.g., TYVEK) can require substantially high relative humidity.

Various embodiments of the disclosed system includes wafer support rings that stack on each other in a manner that provides a gap between adjacent wafer support rings within which a resident wafer is captured. Wafers of various thicknesses can be accommodated in the same shipper with the same total quantity, without affecting the height of the stack. Furthermore, the wafer support rings can include a ridge disposed proximate the perimeter of the wafer to serve as a barrier to the wafer edge such that the wafer edge exclusion is not violated. Also, forces on the wafer shipper are transferred through the wafer support rings, not through the wafers. The material for the rings can be a conductive plastic, such that the humidity constraint in conventional wafer shippers (e.g., TYVEK) is avoided. The wafer support ring can utilize a wide inner flange suitable for automated handling via vacuum cups.

Certain embodiments further provide for accommodation of wafer flats that would otherwise be unsupported during an impact event.

Structurally, a wafer shipping system is disclosed in one embodiment, comprising a plurality of wafer support rings, each wafer support ring comprising: a flange portion concentric about a central axis, the flange portion including a first axial face and a second axial face, the second axial face being opposite the first axial face; a ridge portion that protrudes in an axial direction parallel to the central axis from the first axial face of the flange portion; and structure defining a channel on the second axial face. In this embodiment, a first wafer support ring of the plurality of wafer support rings is stacked atop a second wafer support ring of the plurality of wafer support rings such that a distal edge of the ridge portion of the second wafer support ring is registered within the channel of the first wafer support ring, the first and second wafer support rings defining a gap therebetween, the gap being configured for containing a wafer so that an axial force exerted on the first wafer support ring is transferred to the second wafer support ring without transferring force to the wafer. In one embodiment, the channel includes an inner radial wall defining an inner radius relative to the central axis and an outer radial wall defining an outer radius relative to the central axis. Also in this embodiment, the ridge portion and the channel of each of the plurality of wafer support rings are axially aligned so that the ridge portion is within the inner radius and the outer radius defined by the channel. Optionally, the channel is continuous. The ridge portion can also be continuous and surround the gap defined between the first and second wafer support rings. A substantially continuous band of contact can thus be defined between the distal edge of the ridge portion and the channel.

In various embodiments, the first axial face of the flange portion of each of the plurality of wafer support rings includes a planar registration surface that is radially inset from and adjacent to the ridge portion, the planar surface portion defining a registration plane for a wafer. In one embodiment, the first wafer support ring is configured for engaging a first wafer to provide a substantially continuous band of contact between the first wafer and the planar surface portion of the first wafer support ring, and the second wafer support ring is configured for engaging a second wafer to provide a substantially continuous band of contact between the second wafer and the planar surface portion of the second wafer support ring, whereby the first wafer support and the second wafer support are configured for defining an enclosed void when the first wafer is disposed in the first wafer support ring and the second wafer is disposed in the second wafer support ring. In one embodiment of the disclosure, a wafer is contained in the gap.

The wafer shipping system can further comprise a receptacle portion and a cover portion configured to provide closure of the receptacle portion. In one embodiment, the plurality of wafer support rings are arranged in a stack, the stack being disposed in the receptacle portion, the cover portion contacting the stack when the cover portion is in closure with the receptacle portion to secure the stack between the cover portion and the receptacle portion. In some embodiments, the plurality of wafer support rings are arranged in a stack, the stack being seated on a base of the receptacle portion, the cover portion contacting the stack when the cover portion is in closure with the receptacle portion to secure the stack between the cover portion and the base portion. In one embodiment, the stack includes a lowermost wafer support ring that engages the base of the receptacle portion to define a substantially continuous band of contact therebetween, the lowermost wafer support ring being configured for engaging a lowermost wafer to provide a substantially continuous band of contact between the lowermost wafer and the planar surface portion of the lowermost wafer support ring, whereby the lowermost wafer support and the base are configured for defining an enclosed gas pocket when a lowermost wafer is disposed in the lowermost wafer support.

The cover portion can include a stop portion that extends axially into the cover portion, the stop portion defining a continuous axial face. The stack can include an uppermost wafer support ring that engages the continuous axial face of the stop portion to define a substantially continuous band of contact therebetween, the uppermost wafer support ring being configured for engaging an uppermost wafer to provide a substantially continuous band of contact between the uppermost wafer and the planar surface portion of the uppermost wafer support ring, whereby the uppermost wafer support and the cover portion are configured for defining an enclosed gas pocket when an uppermost wafer is disposed in the uppermost wafer support. In one embodiment, the stop portion depends from a top portion of the cover portion, the stop portion including a plurality of radially extending ribs that extend radially outward from proximate a central axis of the top portion.

In some embodiments, the cover portion includes a stop portion that extends axially into the cover portion, the stop portion defining a continuous axial face. In this embodiment, the stack includes an uppermost wafer support ring that engages the continuous axial face of the stop portion to define a substantially continuous band of contact therebetween. The stack can also include an adjacent wafer support ring in contact with the uppermost wafer support ring, the adjacent wafer support ring being configured for engaging an uppermost wafer to provide a substantially continuous band of contact between the uppermost wafer and the planar surface portion of the adjacent wafer support ring, whereby the uppermost wafer support, the adjacent wafer support, and the cover portion are configured for defining an enclosed gas pocket when an uppermost wafer is disposed in the adjacent wafer support. In various embodiments, the gap is configured to accommodate a 300 mm wafer.

In various embodiments of the disclosure, a wafer support ring is disclosed, comprising: a continuous flange portion concentric about a central axis, the continuous flange portion including a first axial face and a second axial face, the second axial face being opposite the first axial face; a continuous ridge portion that protrudes in an axial direction parallel to the central axis from the first axial face of the continuous flange portion; and structure defining a continuous channel on the second axial face. In this embodiment, the first axial face of the continuous flange portion of each of the plurality of wafer support rings includes a planar registration surface that is radially inset from and adjacent to the continuous ridge portion, the planar surface portion defining a registration plane for a wafer, the continuous ridge portion being of a uniform axial dimension relative to the registration plane. In some embodiments, the continuous channel includes an inner radial wall defining an inner radius relative to the central axis and an outer radial wall defining an outer radius relative to the central axis, the continuous ridge portion and the continuous channel of each of the plurality of wafer support rings are axially aligned so that the continuous ridge portion is within the inner radius and the outer radius defined by the continuous channel. In some embodiments, the continuous channel presents a recessed axial face extending radially between the inner radial wall and the outer radial wall, and the flange portion includes an axial thickness defined between the recessed axial face and the registration plane.

In one embodiment, the continuous ridge portion defines a uniform radial thickness.

In other embodiments, the continuous ridge portion defines a first radial thickness and a second radial thickness, the second radial thickness being greater than the first radial thickness. In these embodiments, the continuous ridge portion can include a plurality of ridge sections, each ridge section including a first arc segment of the first radial thickness, and a second arc segment including the second radial thickness. The continuous ridge portion can include at least one transition between the first radial thickness and the second radial thickness, the at least one transition being included in the second arc segment. Each of the plurality of the arc segments can be characterized as including a corresponding post to present a plurality of posts, each post being defined by the second arc segment.

In some embodiments, the plurality of posts are uniformly distributed angularly about the central axis. The plurality of posts can be: at least three posts and not greater than 12 posts; at least four posts and not greater than 10 posts; or at least six posts and not greater than eight posts.

In some embodiments, a ratio of the second radial thickness to the first radial thickness is within a range of: 1.2 to 3 inclusive; 1.3 9 to 2 inclusive; or 1.4 to 1.8 inclusive.

In some embodiments, the first arc segment of at least one of the plurality of ridge sections is a fraction of an arc length of a corresponding one of the at least one of the plurality of ridge sections, the fraction being in a range of: 70% to 95% inclusive; 75% to 95% inclusive; or 75% to 85% inclusive.

In some embodiments, a ratio of the first radial thickness of the first arc segment to the axial thickness between the recessed axial face and the registration plane is in the range of: 0.1 to 1.5 inclusive; 0.5 to 1.2 inclusive; or 0.8 to 1.1 inclusive.

In various embodiments of the disclosure, a wafer support system is disclosed, comprising a plurality of wafer support rings, each defining a central axis and including a flange portion and an outer rim portion that protrudes in an axial direction parallel to the central axis from a first face of the flange portion, the first face of the flange portion including a planar surface portion that is radially inset from and adjacent to the outer rim portion. In this embodiment, each of the plurality of wafer support rings including a wafer flat support structure that extends radially inward from the flange portion, the wafer flat support structure including a first face that includes a planar surface portion that is radially inset from the planar surface portion of the flange portion, the planar surface portion of the wafer flat support structure defining a linear edge, the linear edge defining a minimum radius from the central axis of the planar surface portion of the wafer flat support structure, the linear edge extending substantially orthogonal to the central axis and substantially perpendicular to the minimum radius. Also, each of the plurality of wafer support rings can further include a first tab portion extending radially outward from and along a first tangential length of the rim portion. The planar surface portions of the flange portion and the wafer flat support structure can define a registration plane. In some embodiments, each of the wafer flat support structures includes a rib that protrudes in an axial direction parallel to the central axis, the rib being radially inset from the outer rim portion and radially outset from the planar surface portion of the wafer flat support structure, the rib including a linear portion that extends parallel to the linear edge of the planar surface portion of the wafer flat support structure. The rib portion and the outer rim portion can also protrude in the same axial direction, the rib portion extending from the first face of the wafer support structure. In one embodiment, the first face of the wafer flat support structure includes an inclined portion that extends radially inward from the linear edge of the planar surface portion of the wafer flat support structure, the inclined portion extending toward the central axis and away from the registration plane. In some embodiments, the first face of the flange portion includes an inclined portion that extends radially inward from the planar surface portion of the flange portion, the inclined portion extending toward the central axis and away from the registration plane.

In one embodiment, the wafer support system further comprises a receptacle portion including a base portion and at least one arcuate wall portion, the base portion being substantially perpendicular to a mounting axis, the at least one arcuate wall portion extending from the base portion, the at least one arcuate wall portion being centered about and substantially parallel to the mounting axis, the at least one arcuate wall portion defining one of a first lateral opening and a first lateral recess dimensioned to receive the first tab portion of the wafer support ring.

In various embodiments, a wafer support ring includes: a second tab portion extending radially outward from and along a second tangential length of the rim portion, the second tangential length being of a different dimension than the first tangential length of the first tab portion; and the at least one arcuate wall portion further defines one of a second lateral opening and a second lateral recess located and dimensioned to receive the second tab portion of the wafer support ring. The first tab portion can be diametrically opposed to the second tab portion. The at least one arcuate wall portion can comprise a pair of opposed arcuate wall portions, the opposed arcuate wall portions being centered about the mounting axis, the pair of opposed arcuate wall portions defining the first opening and the second opening therebetween.

In one embodiment, the wafer support ring includes a third tab portion extending radially outward from and along a third tangential length of the rim portion, and the at least one arcuate wall portion further defines one of a third lateral opening and a third lateral recess located and dimensioned to receive the third tab portion of the wafer support ring. The third tangential length can be of a different dimension than the first tangential length and the second tangential length. The first tab portion, the second tab portion, and the third tab portion can be asymmetrically disposed about the central axis.

In some embodiments, the wafer support ring includes a fourth tab portion extending radially outward from and along a fourth tangential length of the rim portion, the fourth tab portion being diametrically opposed to the third tab portion about the central axis, and the at least one arcuate wall portion further defines one of a fourth lateral opening and a fourth lateral recess located and dimensioned to receive the third tab portion of the wafer support ring. The third tab portion and the fourth tab portion can each define a first plan view profile of substantially same shape and substantially same dimensions. In one embodiment, the shape of the first plan view profile approximates a semi-circle.

In some embodiments, the wafer support ring includes a fifth tab portion extending radially outward from and along a fifth tangential length of the rim portion. The at least one arcuate wall portion can further define one of a fifth lateral opening and a fifth lateral recess located and dimensioned to receive the fifth tab portion of the wafer support ring, and the wafer support ring can include a sixth tab portion extending radially outward from and along a sixth tangential length of the rim portion, sixth tab portion being diametrically opposed to the fifth tab portion about the central axis. The at least one arcuate wall portion can further define one of a sixth lateral opening and a sixth lateral recess located and dimensioned to receive the sixth tab portion of the wafer support ring.

The fifth tab portion and the sixth tab portion can each define a second plan view profile of substantially same shape and substantially same dimensions, the second plan view profile being at least one of different shape and different dimensions than the first plan view profile. In one embodiment, the third tab portion; the fourth tab portion, the fifth tab portion, and the sixth tab portion each include a flat surface for engagement with a vacuum pad. Optionally, at least one of the flat surfaces extends radially inward through the outer rim portion.

BRIEF DESCRIPTION OF THE DRAWINGS

FIG. 2C is an assembled bottom view of the wafer shipper of FIG. 1;

FIG. 2D is an assembled front side view of the wafer shipper of FIG. 1;

FIG. 2E is an assembled right side view of the wafer shipper of FIG. 1;

FIG. 2F is an assembled back side view of the wafer shipper of FIG. 1;

FIG. 2G is an assembled left side view of the wafer shipper of FIG. 1;

FIG. 20 is a sectional view of the wafer support ring of FIG. 18 with a resident wafer in an embodiment of the disclosure;

FIG. 21 is an enlarged, partial view of FIG. 20;

DETAILED DESCRIPTION OF THE DRAWINGS

Figure 8:
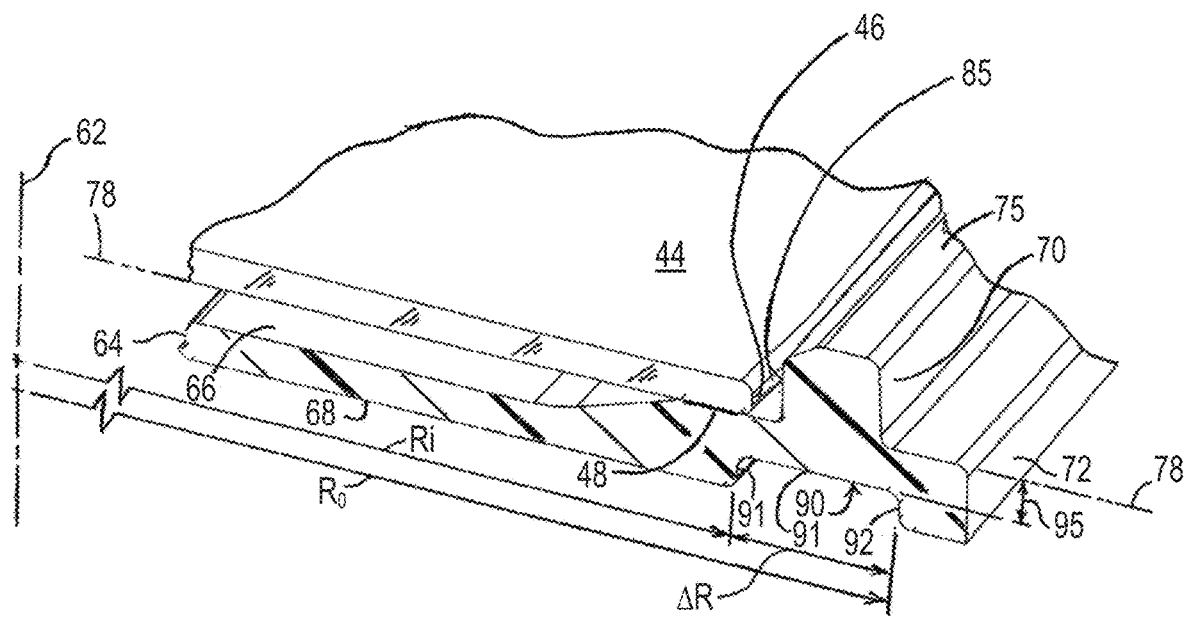
FIG. 8 is an enlarged, partial sectional view of the wafer support ring of FIG. 6 with a resident wafer in an embodiment of the disclosure.

Referring to FIGS. 1 through 5, a wafer shipper 30 is depicted in an embodiment of the disclosure. The wafer shipper 30 includes a cover portion 32 and a receptacle portion 34. A plurality of wafer support rings 36 are disposed in a stack 38 within the wafer shipper 30, the stack 38 being substantially concentric about a mounting axis 42 defined by the cover portion 32 of the wafer shipper 30. The wafer support rings 36 are each shaped and dimensioned to support a wafer 44 having an outer periphery 46 (FIG. 8). The mounting axis 42 is concentric with a z-axis of a cylindrical (r-θ-z) coordinate system 45. In various embodiments, a substantially continuous line or band of contact 48 (FIG. 5) is established between each wafer support ring 36 and the wafer 44 supported thereby.

The cover portion 32 includes a body 54 having a top portion 50 and a continuous side portion 51 that depends therefrom. The top portion 50 can include radially extending ribs 53 that extend from proximate the mounting axis 42 of the cover portion 32. In the depicted embodiment, the radially extending ribs 53 are on the interior of the top portion 50 of the cover portion proximate the mounting axis 42, and transitions to the exterior of the top portion 50 proximate the side portion 51 of the cover portion 32, each radially extending rib 53 being contiguous through the transition. In one embodiment, deflectable corner flanges 52 are cantilevered from the body 54 of the cover portion 32. Each corner flange 52 can include structure defining an aperture 56. In the depicted embodiment, latching members 58 extend from the receptacle portion 34 substantially parallel to the mounting axis 42, each being arranged to pass through a respective one of the apertures 56 to interlock with the respective corner flange 52.

In one embodiment, the cover portion 32 includes a stop portion 59 having an axial face 59a that extends into wafer shipper to engage with and contact the stack 38. The stop portion can include axially extending protrusions 59b that depend from the axial face 59a and occupy an inner radial portion of the axial face 59a. The radial extremity of the axially extending protrusions 59b define a radius Rp.

Figure 5:
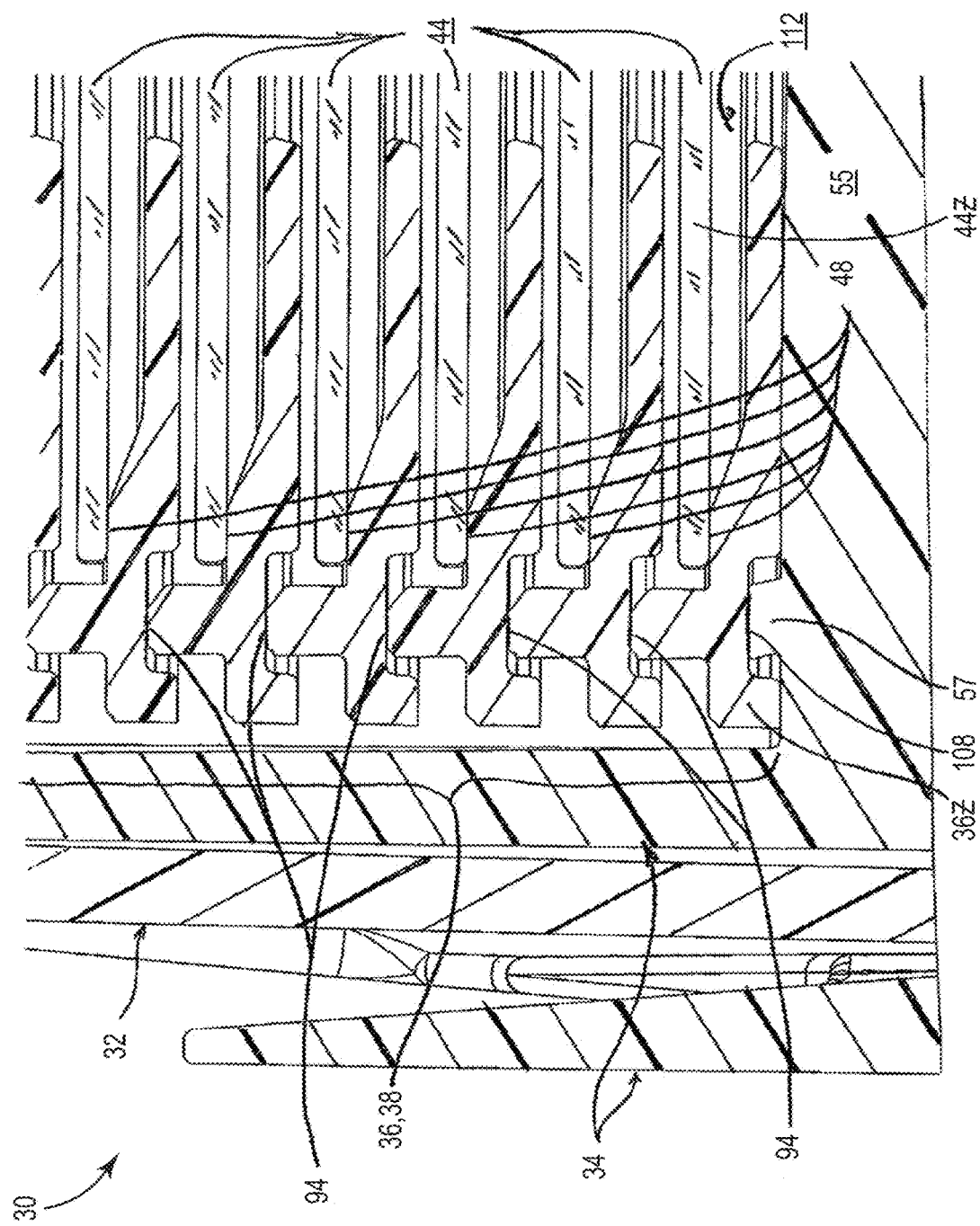
FIG. 5 is an enlarged, partial sectional view of the cover portion, receptacle portion, and stack of the assembled wafer shipper of FIG. 2.

The receptacle portion 34 includes a base 55. In one embodiment, a mounting ring 57 extends upwards from the base 55 to engage a lowermost wafer support ring 36z (FIG. 5). Functionally, the radially extending ribs 53 provide rigidity to the top portion 50 of the cover portion 32 while facilitating flow of material during molding of the cover portion 32. The corner flanges 52 provide spring loading of the cover portion 32 against the top of the stack 38 to secure the stack 38 between the cover portion 32 and the base portion 34. The axially extending protrusions 59b provide alignment of the stack 38 with respect to the mounting axis 42, as described below attendant to FIG. 6.

Figure 6:
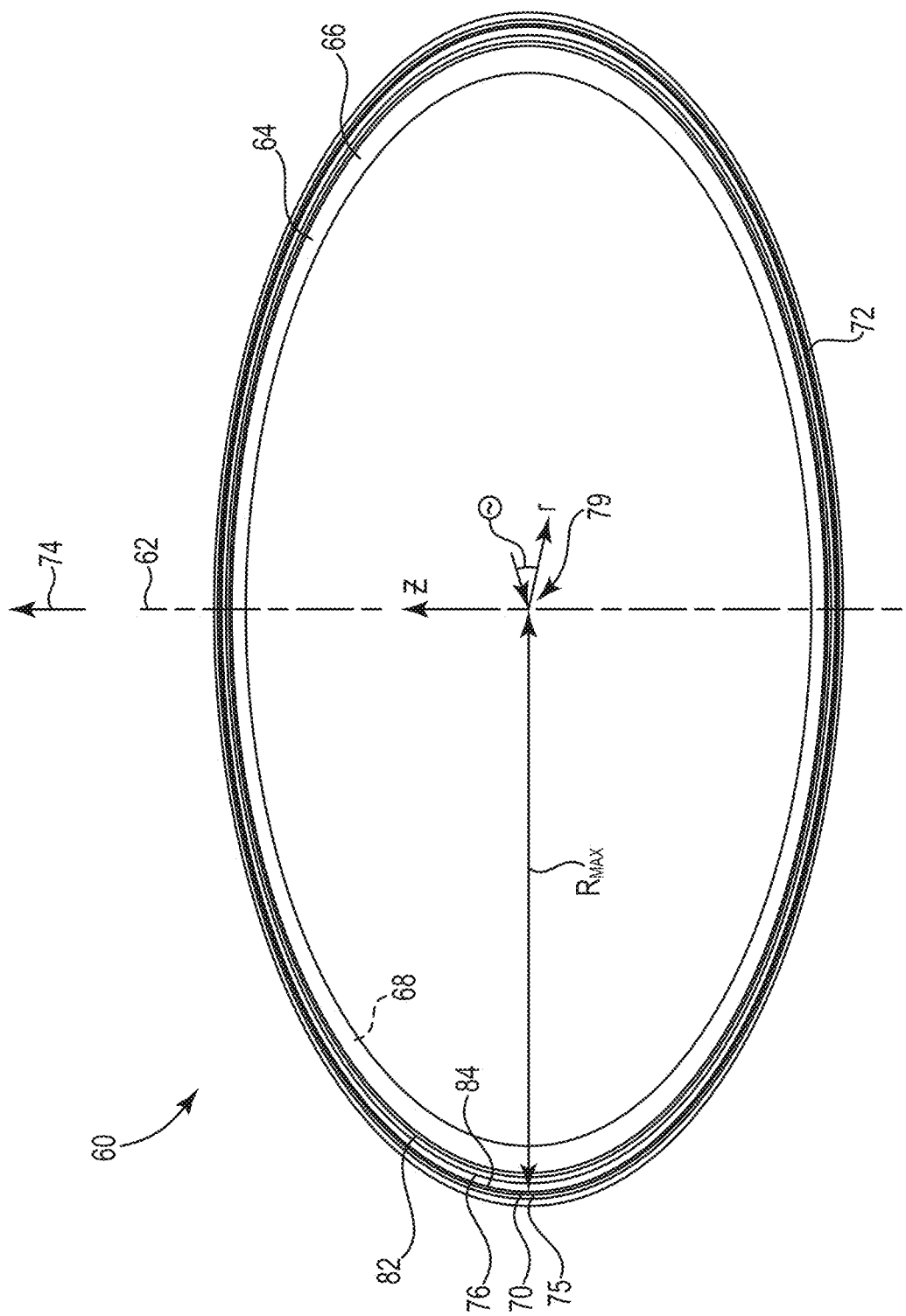
FIG. 6 is a perspective view of a wafer support ring in an embodiment of the disclosure.

Referring to FIG. 6, a wafer support ring 60 (i.e., one of the plurality of wafer support rings 36) is depicted in an embodiment of the disclosure. The wafer support ring 60 defines a central axis 62 and includes a flange portion 64 having a first axial face 66 and a second axial face 68, the second axial face 68 being opposite the first axial face 66. The wafer support ring 60 further includes a ridge portion 70 and an outer rim portion 72.

The ridge portion 70 protrudes in an axial direction 74 parallel to the central axis 62 to a distal edge 75 from the first axial face 66 of the flange portion 64. The first axial face 66 of the flange portion 64 includes a planar surface portion 76 that is radially inset from and adjacent to the ridge portion 70, with the distal edge 75 of the ridge portion 70 extending to a height (axial dimension) 77 (FIG. 7) relative to the planar surface portion 76 and registration plane 78. The central axis 62 is concentric with a z-axis of a cylindrical (r-θ-z) coordinate system 79.

The planar surface portion 76 defines a registration plane 78 (FIGS. 7 and 8) for the resident wafer 44. The substantially continuous line or band of contact 48, referred to in discussion of FIG. 5, is established between the wafer 44 and the planar surface portion 76 (FIG. 8). The first axial face 66 of the flange portion 64 can include an inclined portion 82 that extends radially inward from the planar surface portion 76 of the flange portion 64, the inclined portion 82 extending toward the central axis 62 and away from the registration plane 78.

In the various embodiments, a junction 84 between the ridge portion 70 and the planar surface portion 76 of the flange portion 64 defines a radius Rmax relative to the central axis 62. The radius Rmax can be is dimensioned to provide a close tolerance fit with the outer periphery 46 of the resident wafer 44. Also, the radius Rmax can be said to define a circumference of an inner face 85 (FIG. 7) of the ridge portion 70, the circumference being equal to 2πRmax. The planar surface portion 76 can be dimensioned so as not to encroach on the Fixed Quality Area (FQA) of the resident wafer 44, as stipulated by ISTA-2A when the resident wafer 44 is registered within the wafer support ring 60. Also, in various embodiments, the dimension of Rmax is slightly greater than the radius Rp defined by the radial extremities of the axially extending protrusions 59b. By this construction, the axially extending protrusions 59b are inserted radially inward from the ridge portion 70 of an uppermost wafer support ring 60 of the stack 38 (identified as an uppermost wafer support ring 36a in FIG. 4A), thereby providing alignment of the stack 38 relative to the cover portion 32 upon closure of the wafer shipper 30. In one embodiment, an outer portion of the axial face 59a remains radially outward from the radial extremities of the axially extending protrusions 59b for seating of the stop portion 59 against the uppermost wafer support ring 36a.

Figure 1:
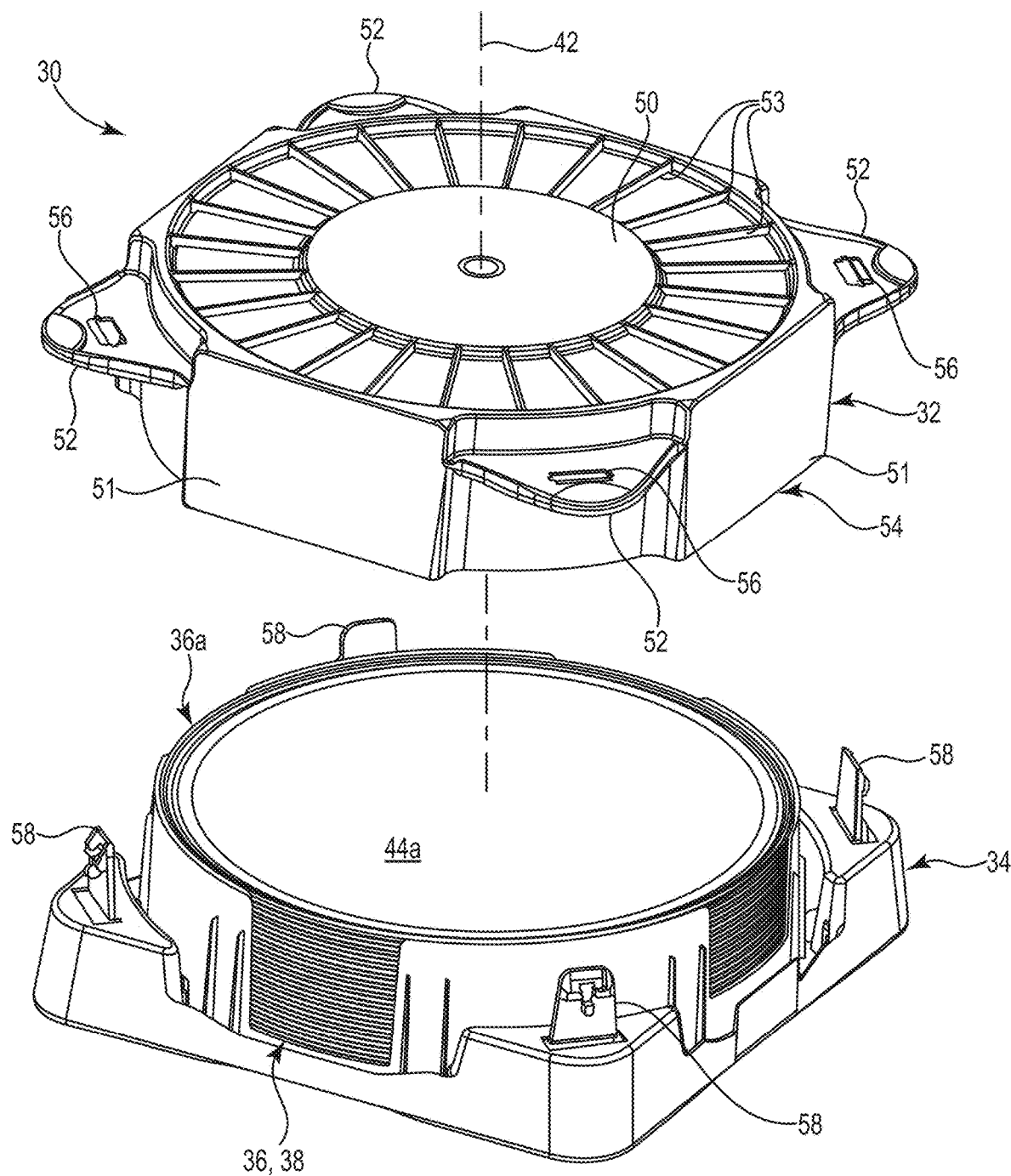
FIG. 1 is a partially exploded view of a wafer shipper in an embodiment of the disclosure.
Figure 2A:
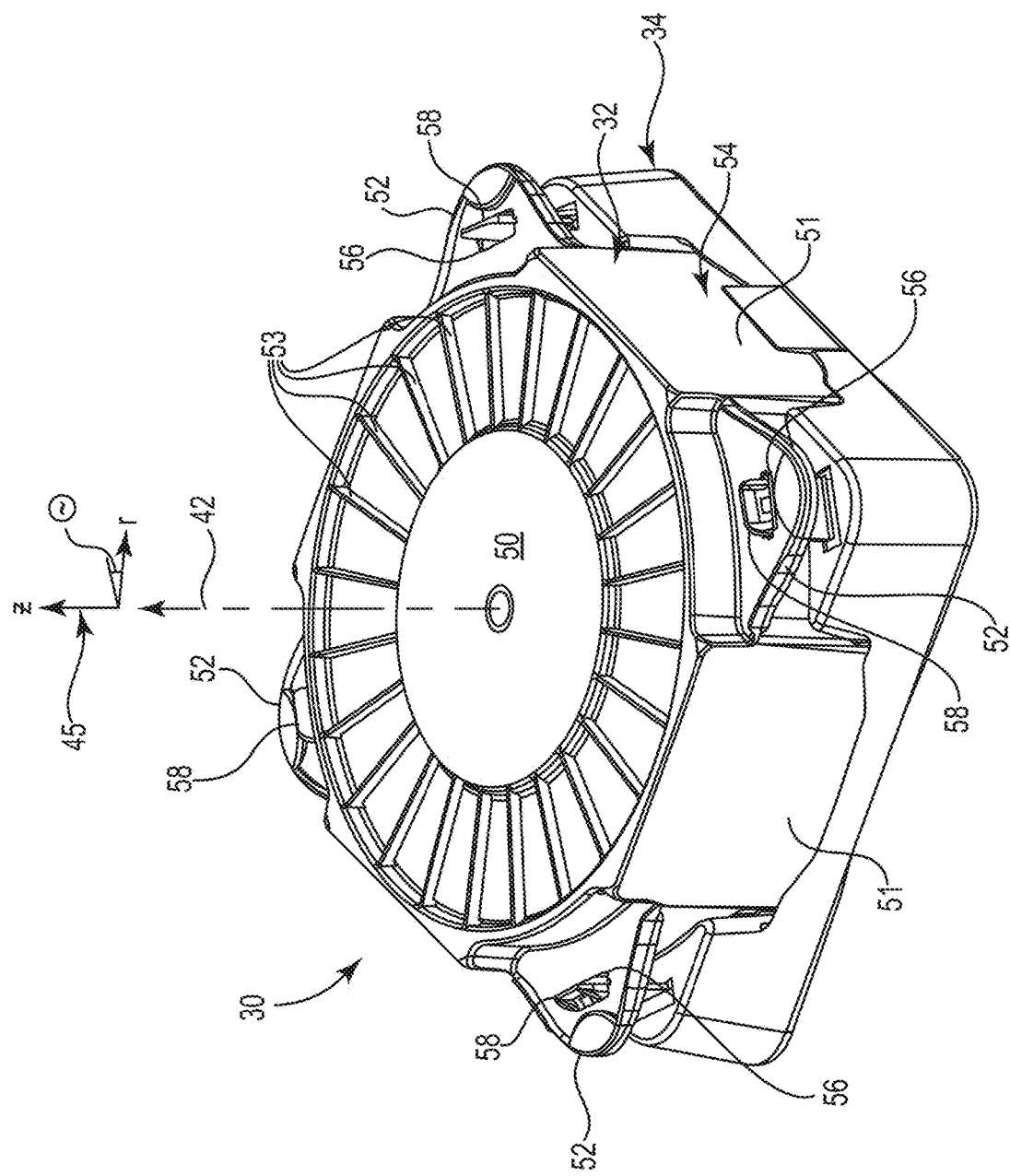
FIG. 2A is an assembled perspective view of the wafer shipper of FIG. 1.
Figure 2B:
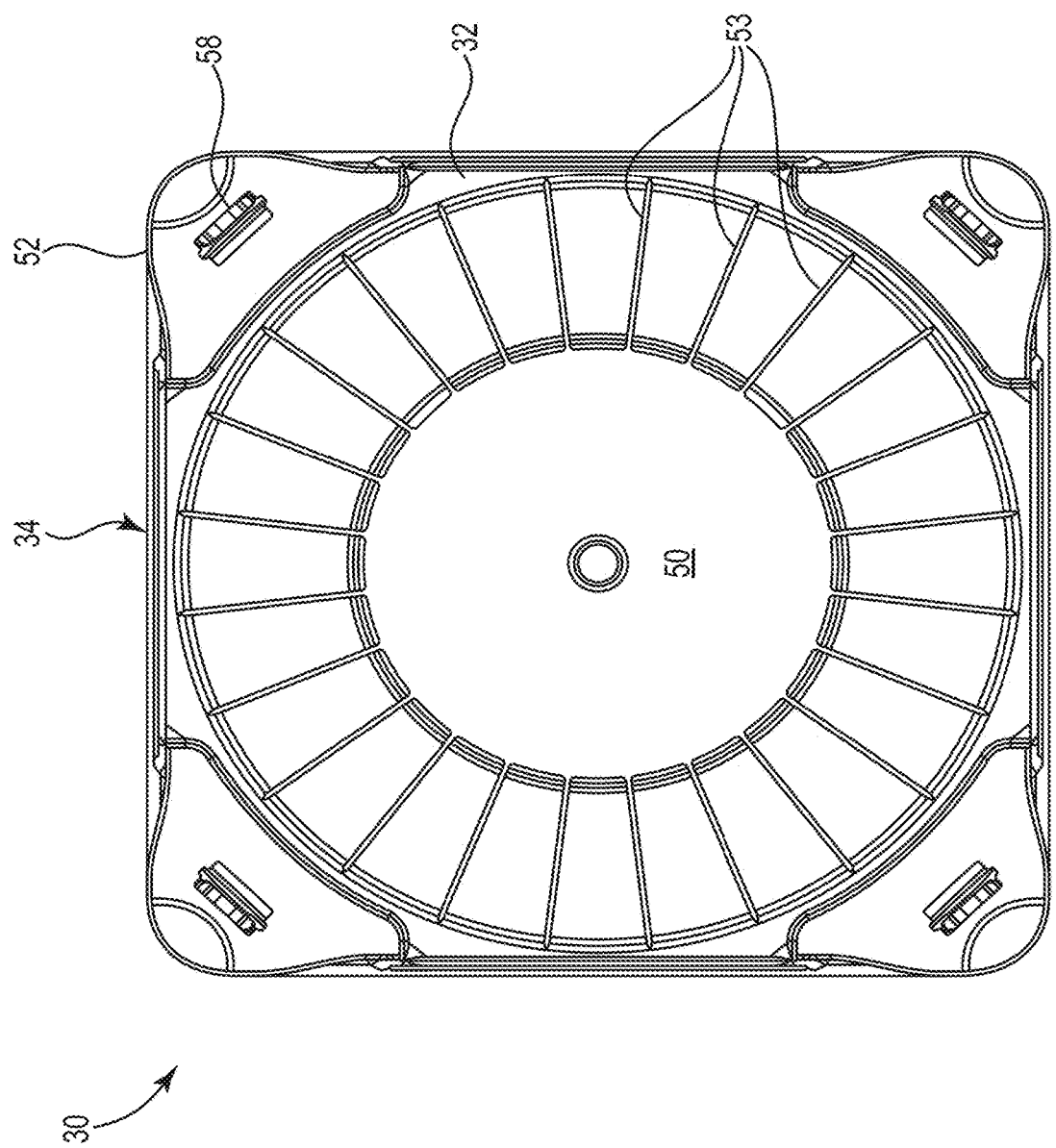
FIG. 2B is an assembled top view of the wafer shipper of FIG. 1.
Figure 3:
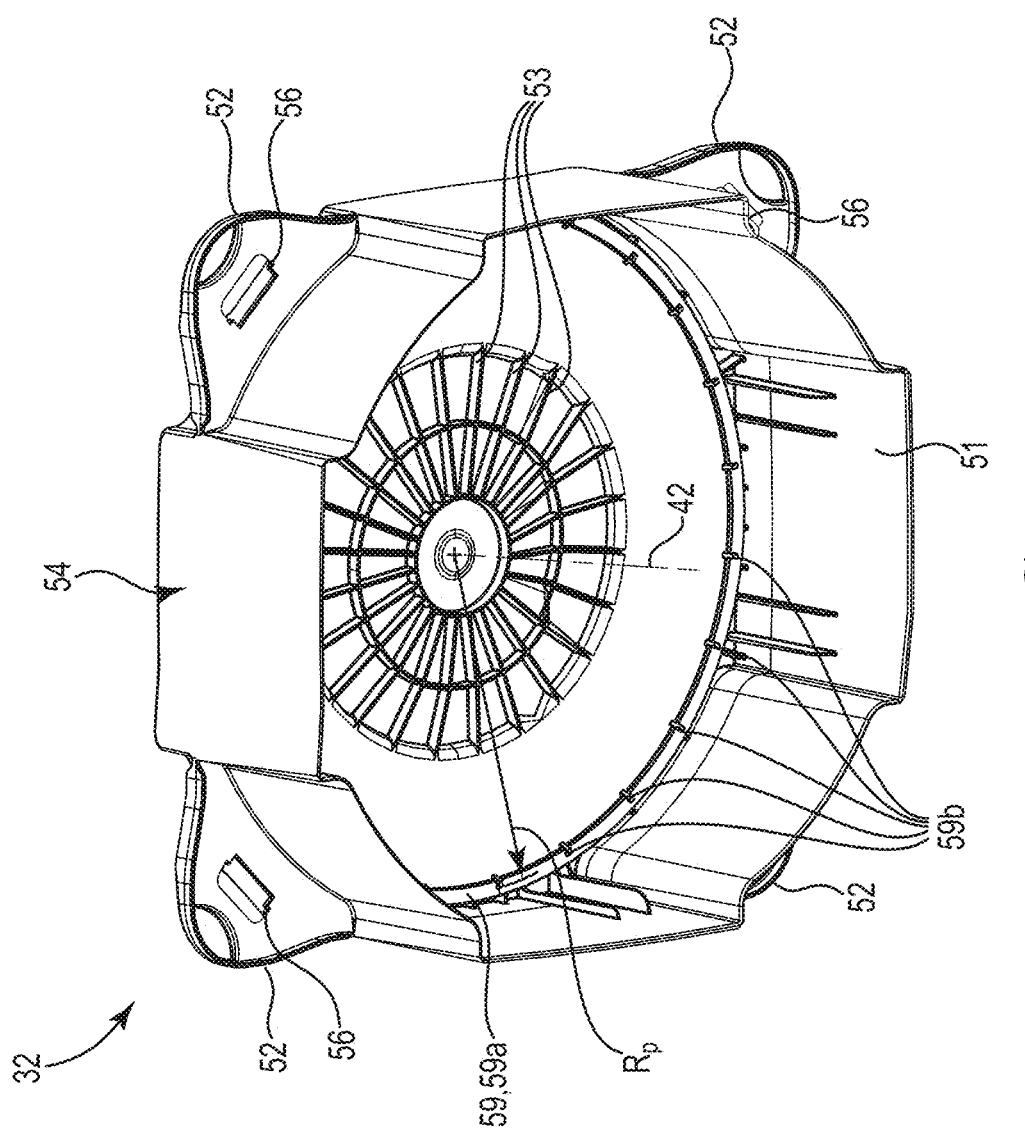
FIG. 3 is a lower perspective view of a cover portion of the wafer shipper of FIG. 1 in an embodiment of the disclosure.
Figure 4:
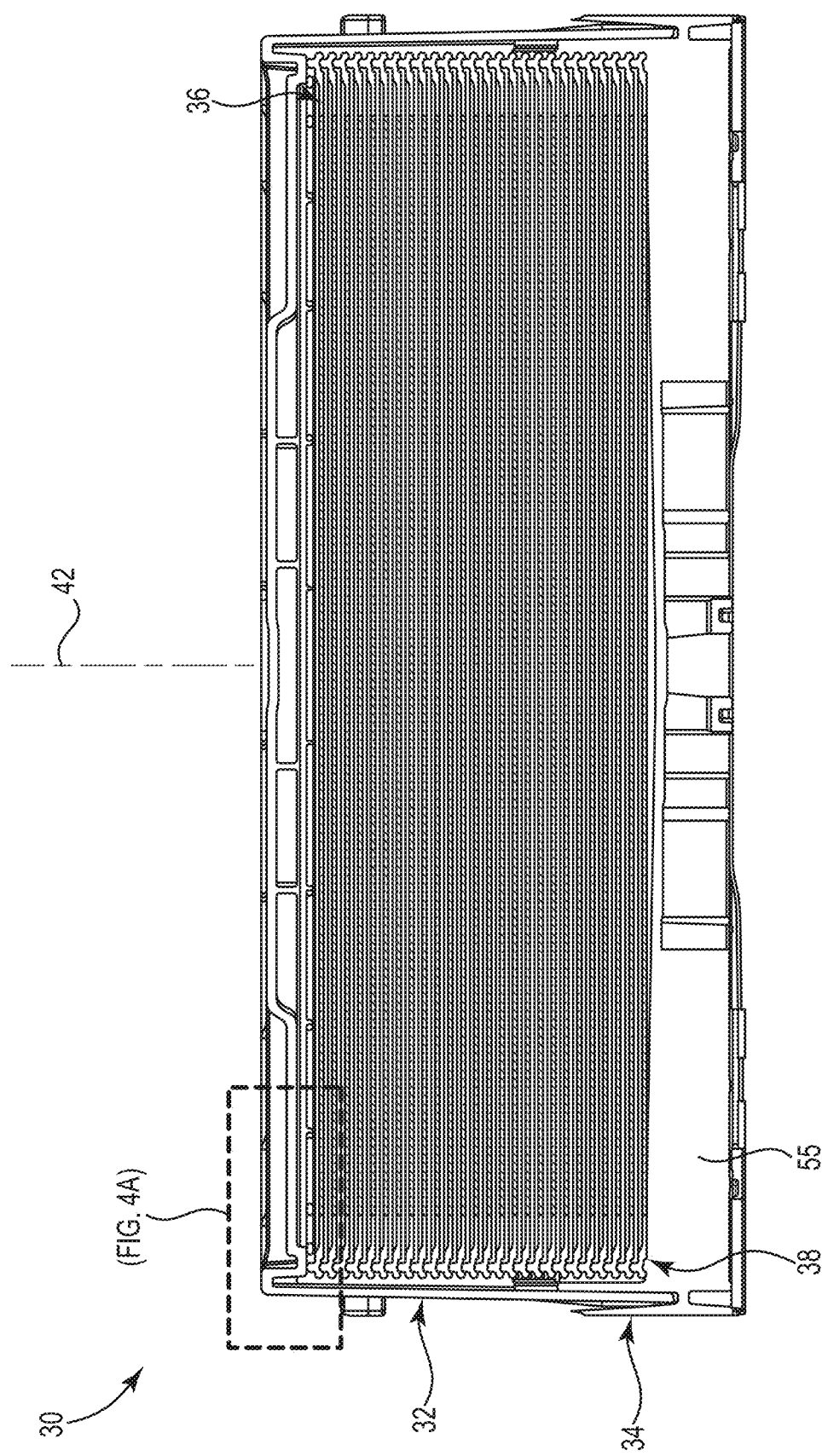
FIG. 4 is a sectional view of the assembled wafer shipper of FIG. 2.
Figure 4A:
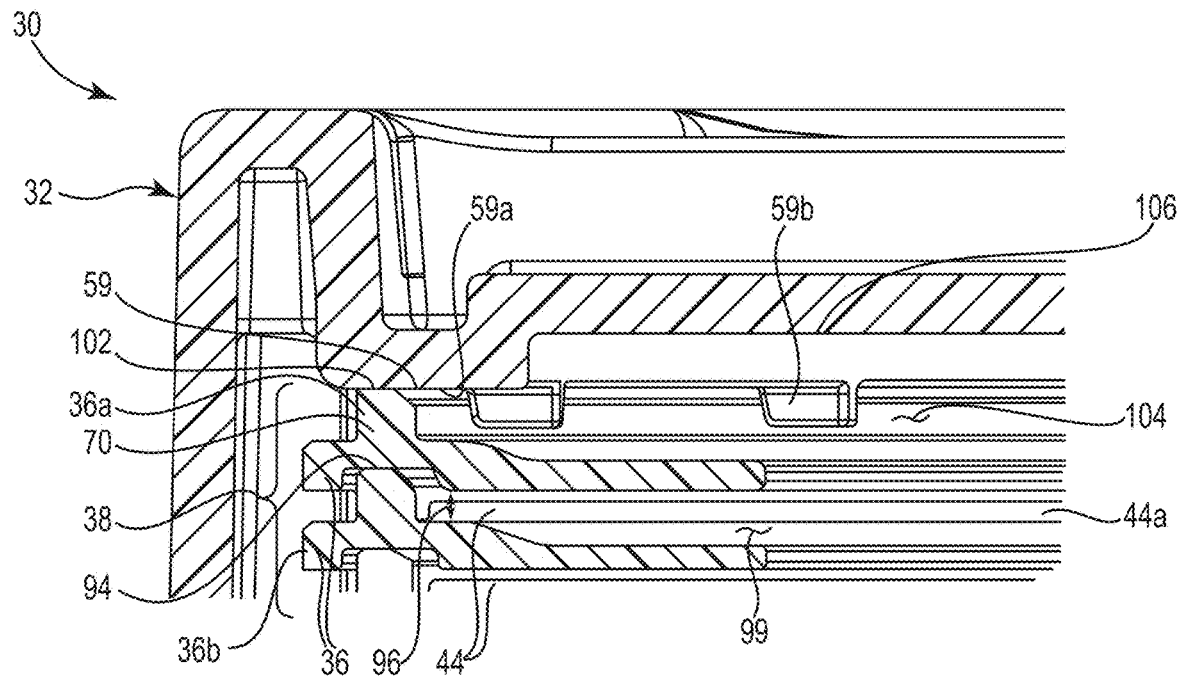
FIG. 4A is an enlarged, partial sectional view of the cover portion and the stack of an assembled wafer shipper of FIG. 3.
Figure 4B:
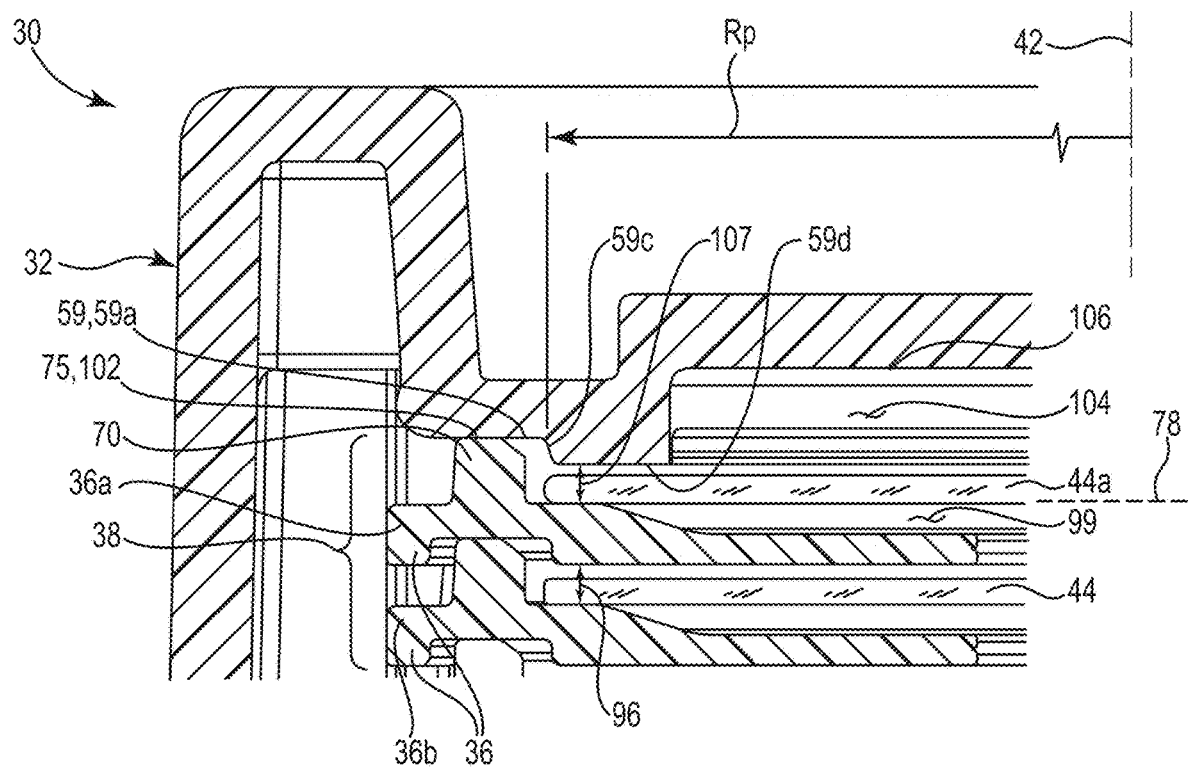
FIG. 4B is an enlarged, partial sectional view of an alternative cover portion in an embodiment of the disclosure.

An alternative to the axially extending protrusions 59b is depicted in FIG. 4B in an embodiment of the disclosure. In this embodiment, the stop 59 defines a step 59c that transitions to a second axial face 59d, the second axial face 59d extending further downward (i.e., further toward the base 55 of the receptacle portion 34) than the axial face 59a. The step 59c can be located at approximately the same radius Rp as the axially extending protrusions 59b of FIG. 3, so as to be inserted radially inward from the ridge portion 70 of the uppermost wafer support ring 36a. By this arrangement of FIG. 4B, the step 59c can provide the same centering function as the axially extending protrusions 59b of FIGS. 3 and 4A.

Figure 7:
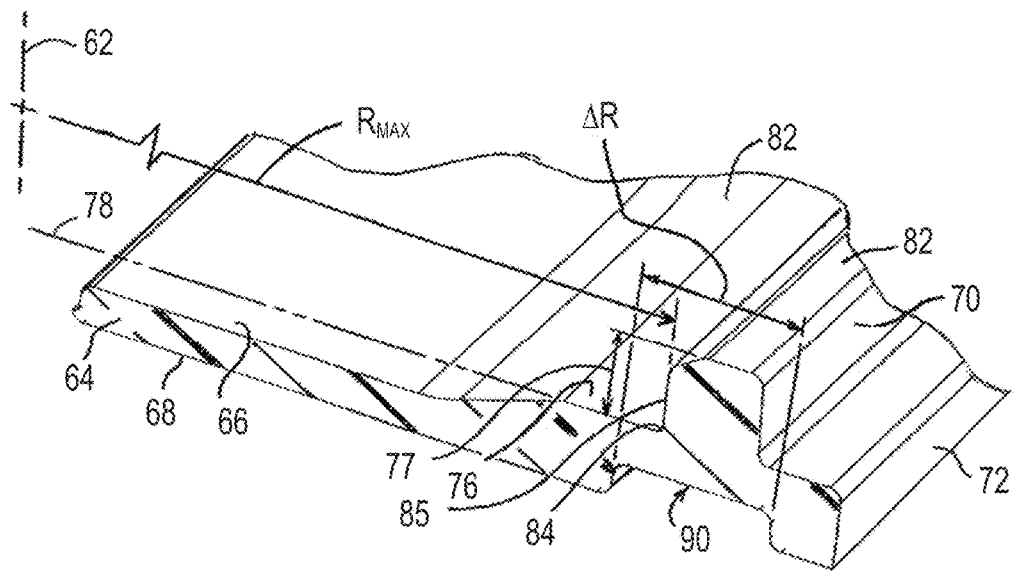
FIG. 7 is an enlarged, partial sectional view of the wafer support ring of FIG. 6.

Referring to FIGS. 7 and 8, sectional views of the wafer support ring 60 without and with the resident wafer 44, respectively, are depicted in an embodiment of the disclosure. The second axial face 68 of the wafer support ring 60 includes structure defining a groove or channel 90. The channel 90 is bounded by an inner radial wall 91, an outer radial wall 92, and a recessed axial face 93 between the inner and outer radial walls 91 and 92 (FIG. 8). The flange portion 64 of the support ring 60 can be characterized as defining an axial thickness 95 between the recessed axial face 93 and the registration plane 78. The inner and outer radial walls 91 and 92 respectively define an inner radius Ri and an outer radius Ro relative to the central axis 62. In some embodiments, the channel 90 is continuous. In one embodiment, the ridge portion 70 is occupies an annular band ΔR on the first axial face 66 that is defined between the inner radius Ri and the outer radius Ro, such that the ridge portion 70 is disposed over the channel 90.

Figure 9:
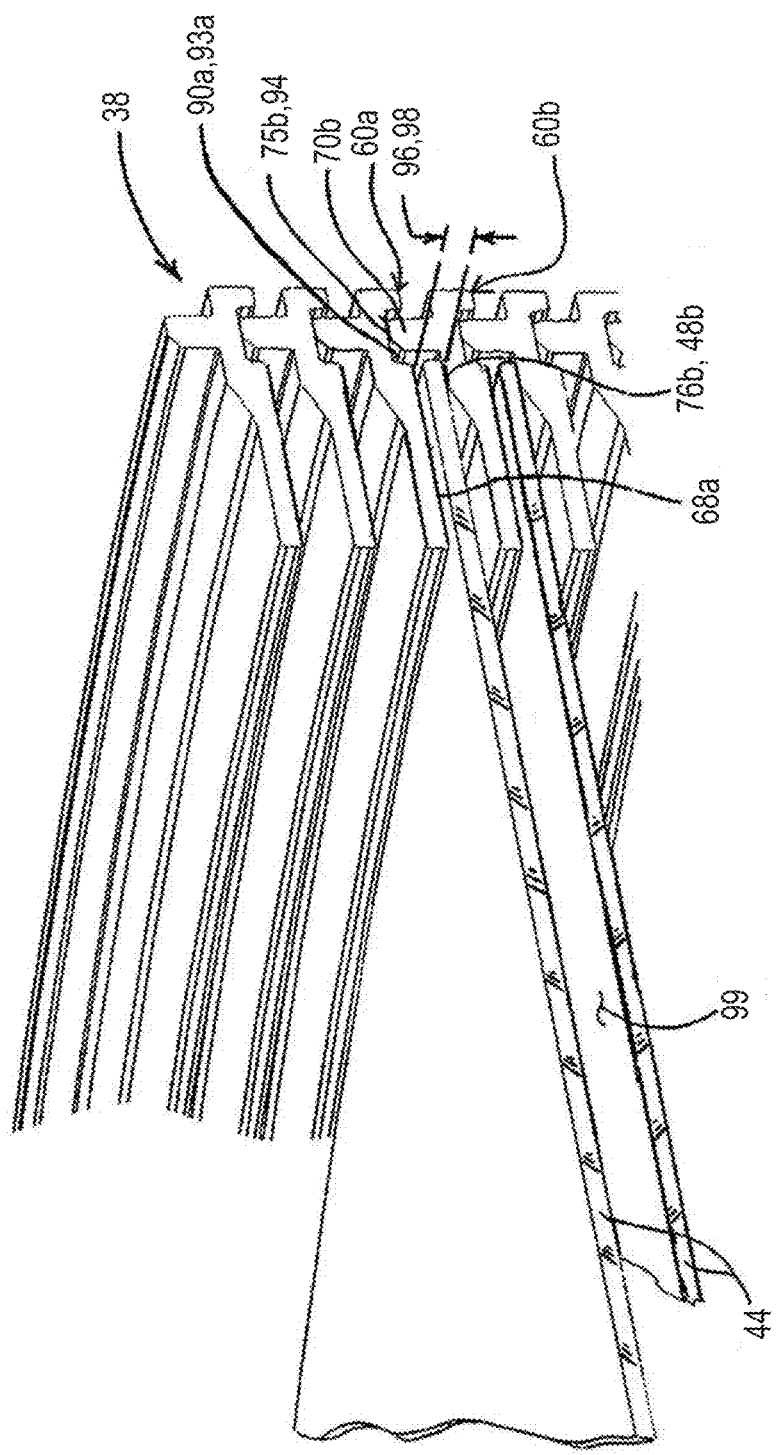
FIG. 9 is a partial sectional view of a stack of wafer support rings with an example resident wafer in an embodiment of the disclosure.

Referring to FIG. 9, a partial sectional view of the assembled stack 38 containing a pair of resident wafers 44 is depicted in an embodiment of the disclosure. In the depicted embodiment, a first wafer support ring 60a is stacked atop a second wafer support ring 60b so that the distal edge 75b of the ridge portion 70b of the second wafer support ring 60b registers within a channel 90a of the first wafer support ring 60a to define a substantially continuous band of contact 94 between the distal edge 75b and the recessed axial face 93a of the channel 90a. A gap 96 having an axial dimension 98 is defined between a planar surface portion 76b of the second wafer support ring 60b and the second axial face 68a of the wafer support ring 60a when the ridge portion 70b is registered within the channel 90a. A void 99 is defined between the adjacent wafers 44, the void 99 being bound on the perimeter by successively stacked wafer supporting rings 60.

In assembly, wafers 44 are loaded into each wafer support ring 60 of the plurality of wafer support rings 36 and the wafer support rings 36 positioned atop each other to form the stack 38. The cover portion 32 is then aligned with and coupled to the receptacle portion 34 so that the latching members 58 are interlocked within the corner flanges 52 via the apertures 56. In various embodiments, the cover portion 32 is dimensioned so that the stop portion 59 is firmly engaged with the stack 38 upon interlock with the receptacle portion 34.

By this engagement (best seen in FIG. 4A), a substantially continuous band of contact 102 is developed between the stop portion 59 and an uppermost wafer support ring 36a of the plurality of wafer support rings 36. An upper gas pocket 104 is thereby defined in the between the cover portion 32 and the stack 38, the upper gas pocket 104 being bounded by the cover portion 32, stop portion 59, contact band 102, uppermost wafer support ring 36a, an adjacent wafer support ring 36b adjacent to the uppermost wafer support ring 36a, and the uppermost wafer 44a. (A boundary 106 of the upper gas pocket 104 is depicted with increased line weight in FIG. 4A for clarity.

Alternatively, the uppermost wafer 44a can be disposed in the uppermost wafer support ring 36a, as depicted in FIG. 4B. In the embodiment of FIG. 4B, a gap 107 is defined between the second axial face 59d and the registration plane 78 of the uppermost wafer 44a. The gap 107 can be of approximately the same dimension as the gap 96, thereby performing the same retention and capture functions as the gaps 96. Also, because the second axial face 59d is located axially downward from the distal edge 75 of the ridge portion 70, the uppermost wafer 44a is prevented from "jumping" the ridge portion 70 of the uppermost wafer support 36a and becoming damaged because of entrapment between the ridge portion 70 and the axial face 59a of the stop portion 59.

It is further understood that the embodiments of FIGS. 3 and 4A can also be configured for housing the uppermost wafer 44a in the uppermost wafer support ring 36a (not depicted). The axially extending protrusions 59b can have an axial dimension that provides an axial clearance (not depicted) between their lower extremities and the registration plane 78, allowing a wafer 44 to be disposed in the uppermost wafer support ring 36a. The axial clearance thus defined can operate similar to the gap 107 of FIG. 4B.

Also in assembly, because of the load imparted on the stack 38 by the stop portion 59, the force is transferred through the stack 38 to firmly engage the lowermost wafer support ring 36z with the mounting ring 57 of the base 55 of the receptacle portion 34. This engagement forms a substantially continuous band of contact 108 between the lowermost ring 36z and the mounting ring 57. A lower gas pocket 109 is thereby defined, bounded by the base 55, mounting ring 57, lowermost wafer support ring 36z, and a lowermost wafer 44z disposed in the lowermost wafer support ring 36z.

Herein, a "substantially continuous band of contact" is an interface that is uninterrupted in the θ-coordinate of an r-θ-z coordinate (e.g., coordinates 45 and 79) and provides contact across the interface except at microscopic level, where surface roughness and slight surface imperfections such as scratches and a shallow waviness may create discontinuities in the contact. Hence, the contact is not continuous in a microscopic sense, but is "substantially continuous."

Due to manufacturing tolerances of the plurality of wafer support rings 36, the height of the stack 38 can vary notably from one stack to another. Thus, in some embodiments, the wafer shipper 30 is configured so that when the cover portion 32 is interlocked with the receptacle portion 34, the latching members 58 are in axial tension for a range of heights for the stack 38 that are within the accumulated build up uncertainty of the stack 38, with the flexible corner flanges 52 flexing to take up the build up uncertainty of the stack 38. By this arrangement, the interlocking of the cover portion 32 to the receptacle portion 34 assures that the stop portion 59 exerts a compressive force on the stack 38. Such arrangement is discussed in further detail in a U.S. provisional application No. 62/089,103 entitled "HORIZONTAL WAFER SHIPPER WITH INTEGRAL CORNER SPRING FOR WAFER CONTAINMENT", owned by the applicant of the present application and filed on even date therewith, the contents of which are hereby incorporated by referenced herein in its entirety for all purposes, except for express definitions included therein.

Functionally, the resident wafer 44 is captured within the gap 96 and is limited in axial movement during the rigors of transport (e.g., during an impact episode). The close tolerance fit between the junction 84 and the outer periphery 46 of the resident wafer 44 limits lateral movement of the resident wafer(s) 44 during transport. The channel 90a further prevents the wafer 44 from "jumping" the ridge portion 70b and becoming damaged because of entrapment between the ridge portion 70b and the second axial face 68a of the adjacent wafer support ring 60a.

The registration of the resident wafer 44 and the planar surface portion 76 further provides a flow restriction between the resident wafer 44 and the wafer support ring 60b. During an impact episode, the flow restriction can act as a damper that slows the release of gas from the void 99, as well as from voids defined between other adjacent wafers and the plurality of wafer support rings 36. The same dynamic applies to the trapped gas bubble or constrained gas pocket of the upper and lower gas pockets 104 and 109. Due to the effect of the gas within a given void 99 an/or the upper and lower gas pockets 104 and 109 the being slowly released ("slow" relative to the duration of the impact event), there is a damping effect that further cushions the resident wafer(s) 44 from impact damage.

In some embodiments (FIG. 4A), the uppermost wafer support ring 36a of the plurality of wafer support rings 36 is unoccupied (i.e., does not contain a wafer). In such embodiments, the uppermost wafer support ring 36a serves to capture an uppermost wafer 44a that is disposed in the adjacent wafer support ring 36b (i.e., the wafer support ring 36b upon which the wafer support ring 36a is mounted). By this arrangement, the uppermost wafer 44a residing in the wafer support ring 36b is prevented from being dislodged from the wafer support ring 36b during an impact event. Because the wafer support rings 36a and 36b of the stack 38 are secured by the compression force applied by the stop portion 59, the gap 96 within which the uppermost wafer 44a resides is maintained during an impact event, and the cushioning effect described above is also maintained and operative.

Figure 10:
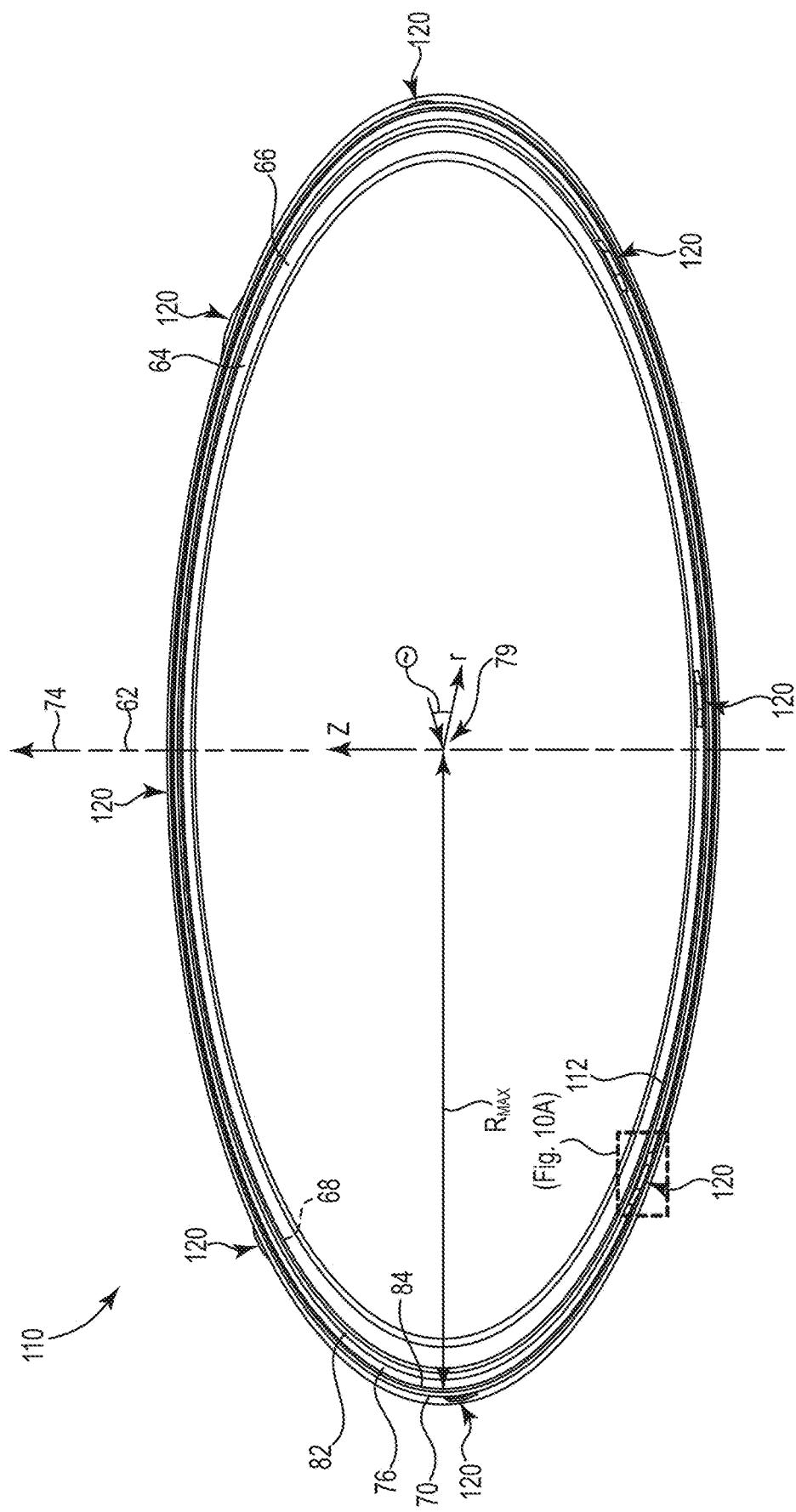
FIG. 10 is a perspective view of a wafer support ring defining a plurality of posts in an embodiment of the disclosure.
Figure 11:
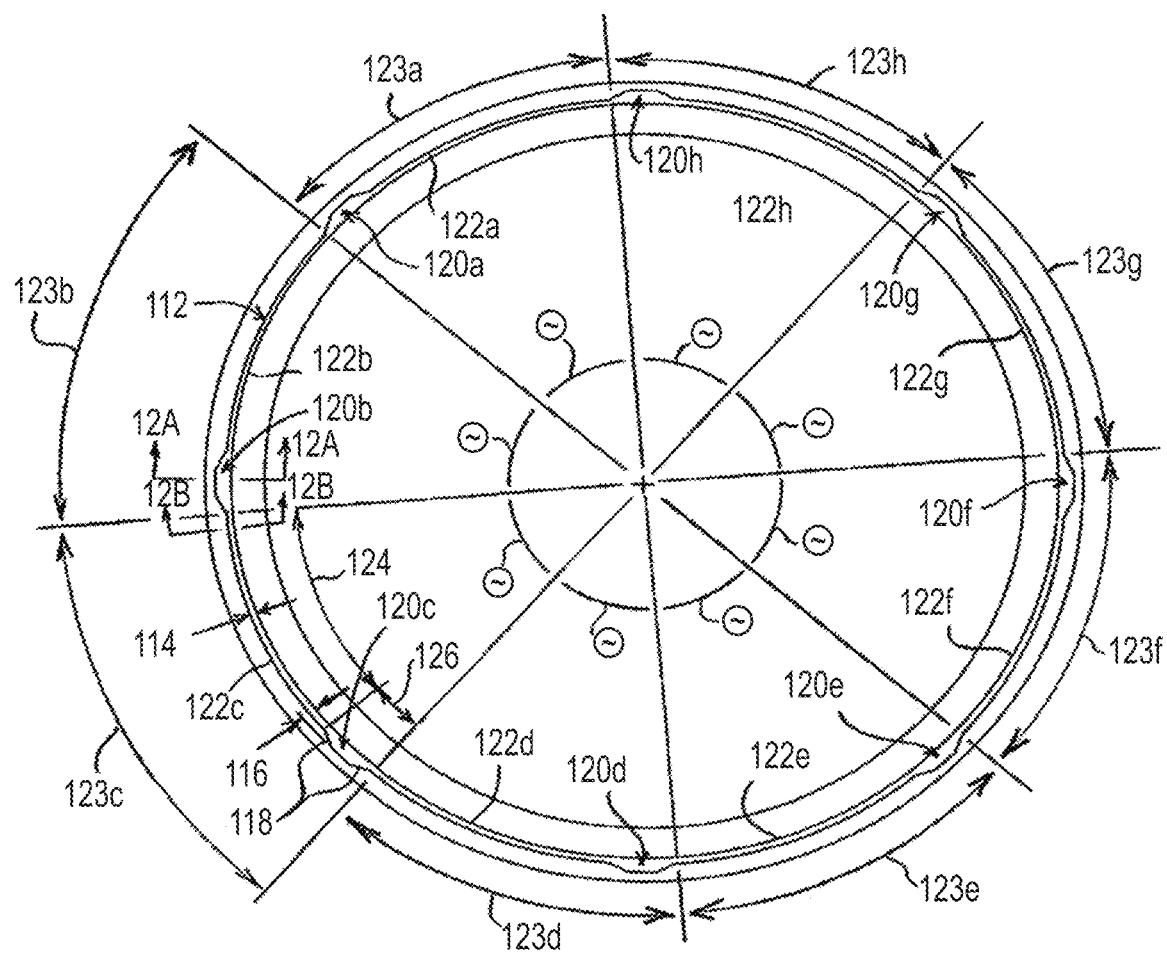
FIG. 11 is a simplified plan view of the wafer support ring of FIG. 10 with the posts enhanced for clarity in an embodiment of the disclosure.
Figure 12A:
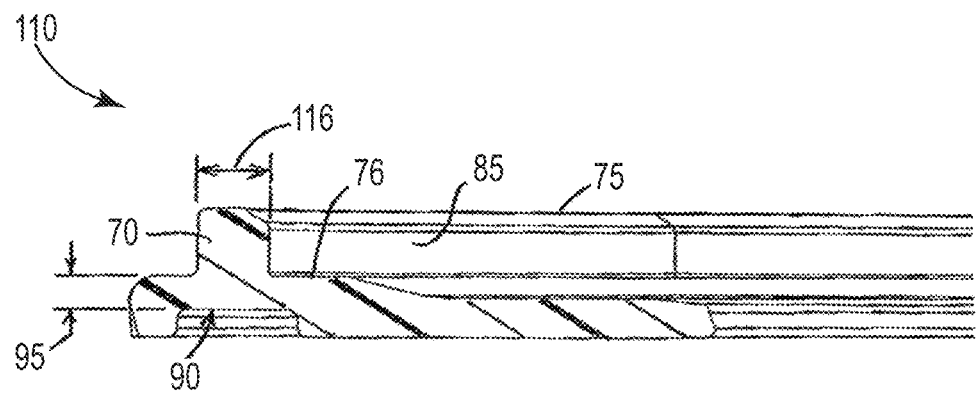
FIGS. 12A and 12B are enlarged sectional views of the wafer support ring of FIG. 10.
Figure 12B:
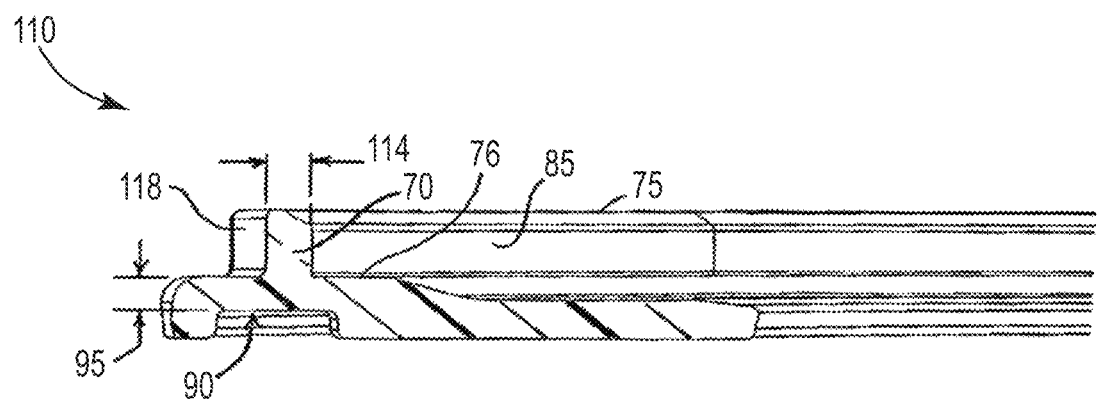

Referring to FIGS. 10 through 12, a wafer support ring 110 is depicted in an embodiment of the disclosure. The wafer support ring 110 includes many of the same components and features as the wafer support ring 60, which are indicated with same-numbered numerical references. The wafer support ring includes a ridge portion 112 that protrudes in the axial direction 74 parallel to the central axis 62 from the first axial face 66 of the flange portion 64. The ridge portion 112 defines a first radial thickness 114 and a second radial thickness 116, the second radial thickness 116 being greater than the first radial thickness. In some embodiments, one or more transitions 118 are defined between the first and second radial thicknesses 114 and 116. The portions of the ridge portion 112 that include the second radial thickness 116 and any adjacent transition(s) 118 are indicated at FIG. 11 as posts 120a through 120h, which are referred to herein generically or collectively as post(s) 120.

In the depicted embodiment, the ridge portion 112 is divided into eight ridge sections 122a through 122h, referred to generically and collectively as ridge section(s) 122. Each ridge section 122 has a respective arc length, depicted at FIG. 11 as arc lengths 123a through 123h, and which are referred to herein generically or collectively as arc length(s) 123. The arc lengths 123 can be characterized in either units of length (e.g., centimeters) or angle (e.g., degrees). Each ridge section 122 includes a first arc segment 124, defined as the portion of the ridge section 122 having the first radial thickness 114 between two neighboring posts 120, and a second arc segment 126, defined as the portion of the ridge section 122 having the second radial thickness 116 and any transition(s) 118 adjacent thereto (i.e., a given post 120). (The first and second arc segments 124 and 126 are depicted only for ridge section 122c in FIG. 11, but apply to all arc segments 122.) Optionally, and as presented in the depicted embodiment, the second arc segments 126 are uniformly distributed angularly about the central axis 62, such that each ridge section 122 subtends the same angle θ.

In various embodiments, a ratio of the second radial thickness 116 to the first radial thickness 114 is within a range 1.4 to 1.8 inclusive; in other embodiments, the ratio is within a range of 1.3 to 2 inclusive; in still other embodiments, the ratio is within a range of 1.2 to 3 inclusive. (Herein, a range that is said to be "inclusive" includes the endpoint values stated for the range.) In various embodiments, a majority of the circumference of the ridge portion 112 is of the first radial thickness 114. In some embodiments, the first arc segment 124 of a given ridge section 122 is from 75% to 85%(inclusive) of the arc length 123 of the ridge section 122; in other embodiments, from 75% to 95% inclusive; in other embodiments, from 70% to 95% inclusive. In various embodiments, the number of posts 120 is between 3 and 12 inclusive; in some embodiments, between 4 and 10 posts 120 inclusive; in some embodiments, between 6 and 8 posts 120 inclusive. The posts 120 can be, but need not be, equally distributed about the central axis 62 as depicted.

Functionally, the thinner first radial thicknesses 114 reduces the influence of shrinkage of the first arc segments 124 that is inevitable with certain injection molded materials, thereby preventing warpage of the support ring 110. That is, for ridge sections 122 that incorporate a sufficiently thick radial thickness relative to the axial thickness 95, the effect of shrinkage exerts a radial force on the top of the flange portion 64 that is sufficient to cause the flange portion to bow perceptibly (i.e., to cause the support ring 110 to fall outside specified flatness and waviness tolerances). For ridge sections 122 where the radial thickness is sufficiently thin, the force exerted by the shrinkage can be diminished, so that specified manufacturing tolerances are maintained. In various embodiments, warpage is sufficiently abated where a ratio of the first radial thickness 114 to the axial thickness 95 is in the range of 0.1 to 1.5 inclusive. In some embodiments, the ratio of the first radial thickness 114 to the axial thickness 95 is in the range of 0.5 to 1.2 inclusive; in some embodiments, 0.8 to 1.1 inclusive.

The posts 120 provide load-bearing capability for stacking the wafer support rings 110 without buckling or fracturing, for example in an impact event. The posts 120, while presenting a thicker radial thickness, constitute a small enough portion of the support ring 110 so as not to cause significant warpage of the support ring 110 during cooling. In one embodiment, the height 77 is uniform around the circumference of the ridge portion 112, thereby retaining certain favorable operating characteristics when stacked with other support rings, as described below.

Figure 10A:
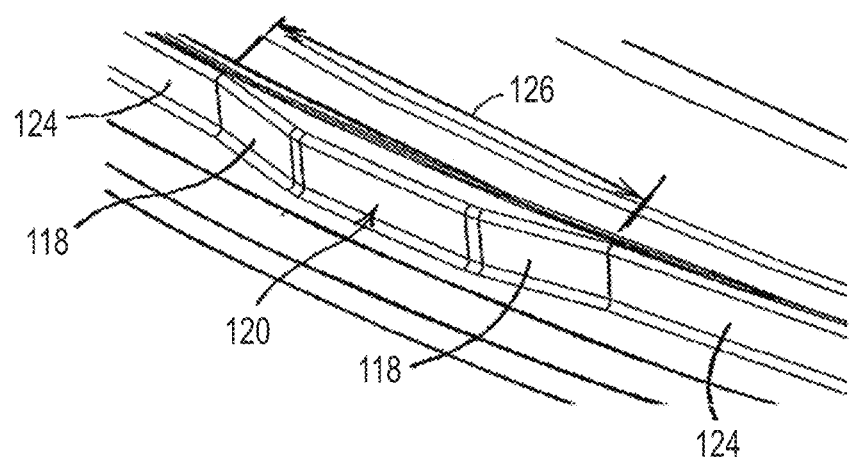
FIG. 10A is an enlarged view of a post of FIG. 10.
Figure 10B:
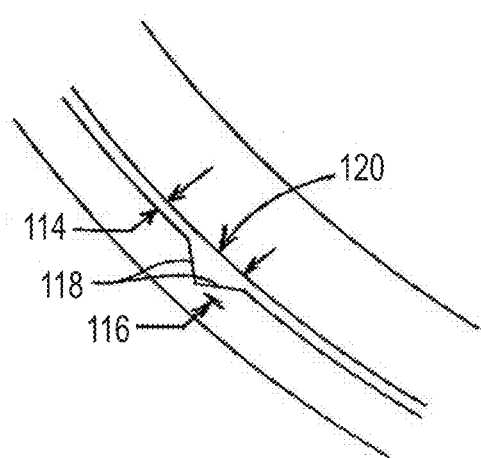
FIGS. 10B through 10D are plan views of alternative post arrangements in embodiments of the disclosure.
Figure 10C:
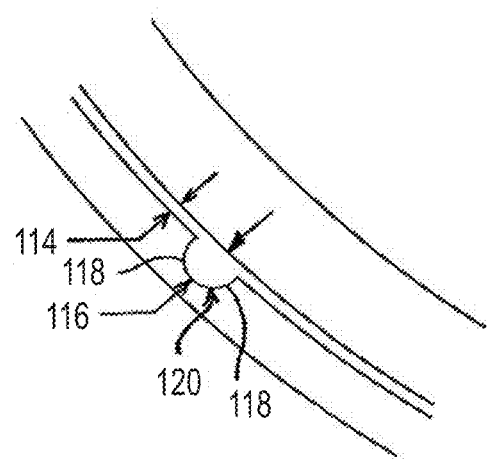
Figure 10D:
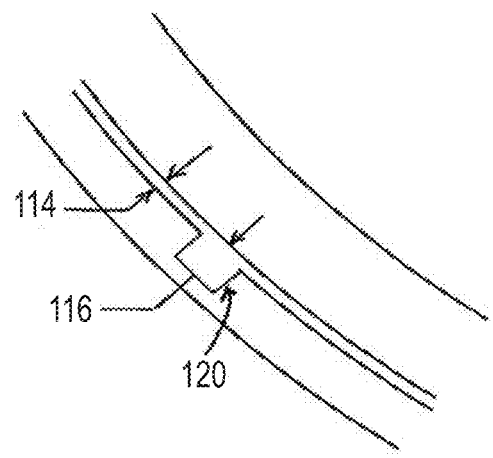

The posts 120 can be of various footprint shapes, including the alternate shapes. In the embodiment of FIG. 10, the second radial thickness 116 in combination with the transitions 118 define posts 120 having a polygonal shape (FIG. 10A). Alternatively, non-limiting examples of the footprint shapes for the posts 120 include a triangular profile (FIG. 10B), a semi-circular profile (FIG. 10C), and a rectangular profile (FIG. 10D).

Figure 13:
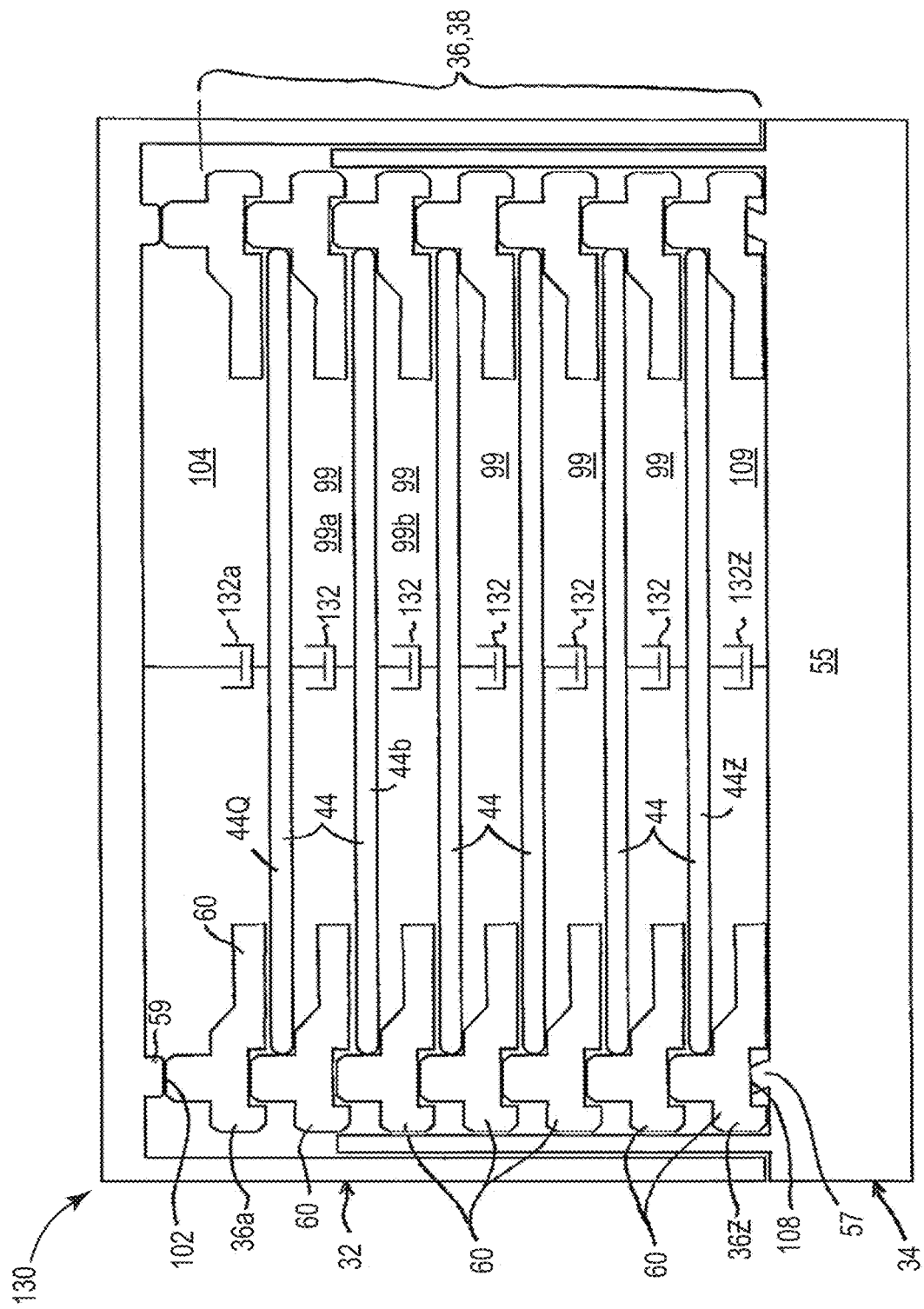
FIG. 13 is a schematic of a wafer shipper depicted as a multiple damper system and utilizing a stack that does not transfer compression forces to the resident wafers in an embodiment of the disclosure.

Referring to FIG. 13, a wafer shipper 130 is schematically depicted in an embodiment of the disclosure. The wafer shipper 130 is a simplified version of the wafer shipper 30 to facilitate a discussion of the dampening dynamics of the wafer shipper 30, and thus has many of the same components and attributes of the wafer shipper 30, which are indicated with same-numbered numerical references. The wafer shipper 130 schematically depicts the voids 99, the upper gas pocket 104, and the lower gas pocket 109 as dampening chambers that are analogously represented as dashpots that are serially connected. Dashpots 132 represent the dampening provided by the voids 99; a dashpot 132a represents the dampening provided by the upper gas pocket 104; and a dashpot 132z represents the dampening provided by the lower gas pocket 109.

During an impact event, the wafer shipper 130 is deflected, causing the gas within to be suddenly and momentarily compressed. Because the voids 99, upper gas pocket 104, and lower gas pocket 109 are analogous to a series of dashpots 132, 132a, and 132z, the effect of the compression is spread out over all of the wafers 44. Consider a compression that originates by an inward deflection of the top of the cover 32. This acts to compress the gas in the upper pocket 104, which in turn deflects the uppermost wafer 44a downward. The downward deflection of wafer 44a is resisted by compression of the void 99a that is adjacent to wafer 44a, thus keeping the magnitude of the deflection of the uppermost wafer 44a in check. The compression of the void 99a causes an adjacent wafer 44b to deflect downward, which is resisted by compression of the void 99b, and so on. The deflection/compression sequence rapidly progresses through the stack 38.

Consider also deflection of the uppermost wafer 44a that suddenly and effectively expands the volume of the upper pocket 104 (e.g., where the distance between the wafer 44a and the cover portion 32 is suddenly increased). Such action would momentarily decrease the pressure within the upper gas pocket 104. The momentary decrease in pressure can act as a partial vacuum force on the wafer, retarding the tendency of the uppermost wafer 44a and cover 32 to deflect away from each other. The retardation of the separation can also act to reduce the deflection of the uppermost wafer 44a relative to a system that does not have a trapped gas pocket 104. This same partial vacuum effect also works for the voids 99 defined by wafers 44 separate from each other, as well as the wafer 44z and lower gas pocket 109.

Accordingly, because of the substantially continuous bands of contact 48, 94, 102, and 108, a network of slow leaking gas enclosures is established between the voids 99 and the enclosed upper and lower gas pockets 104 and 109 which acts to distribute the compression caused by the impact load. That is, the substantially continuous bands of contact 48, 94, 102, and 108 create flow restrictions therethrough when the voids 99 and the enclosed upper and lower gas pockets 104 and 109 become suddenly pressurized, for example during a compression experienced during an impact event.

It is contemplated that the wafers 44 may lift away from the planar surface 76 of the flange portion 64 during an impact event, particularly for thinner wafers 44 that leave substantial clearance between the wafer 44 and the gap 96 within which the wafer 44 resides, such that the otherwise substantially continuous line or band of contact 48 is no longer continuous. While the lifting away may somewhat vitiate the restriction to flow, the lifting of the wafer 44 is limited by the clearance between the wafer 44 and the gap 96, so that any such opening may be limited to a small dimension. The small dimension of the lifting away can still effectively restrict the flow to create a slow release of gas relative to the duration of an impact episode.

Without flow restriction caused by the substantially continuous bands of contact 48, 94, 102, and 108, the compression load would not be distributed as described above. For example, without a flow restriction across the substantially continuous band of contact 102 of the upper pocket 104, the uppermost wafer 44a could deflect upward in an unchecked manner during an impact event, which could cause damage to the uppermost wafer 44a. Likewise, an impact event that would cause the lowermost wafer 44z to deflect downward could cause damage if the lower pocket there were no flow restriction provided by the substantially continuous band of contact 108 to provide the dampening effect.

The dampening effect is particularly beneficial in for larger diameter wafers (for example, but not limited to, 300 mm and 450 mm wafers), where the spans of the wafer between support points can be quite large, leading to substantial deflection of a given wafer. The dampening can also help prevent adjacent wafers from colliding with each other during deflection. That is, because the analogous dashpots 132 are in series, the wafers tend to deflect substantially in the same direction, mitigating the chances of any two wafers colliding at their respective maximum deflection points. This aspect of the dampening mechanism can enable smaller separation between the resident wafer for a more densely packed stack.

The dampening effect not only reduces the deflection of the resident wafers 44; the dampening effect also reduces the degree to which thinner wafers 44 are lifted off its respective wafer support ring 36. "Thinner wafers" are wafers that do not substantially fill the gap 96 between adjacent wafer support rings 36 (e.g., wafer support rings 60a and 60b of FIG. 9). Accordingly, the wafers can be displaced or "rattle" within the gap 96 during impact events or periods of high vibration, which can damage the wafer 44 proximate the outer periphery 46. The dampening effect of the voids 99 and gas pockets 104 and 109 can act to reduce or retard (slow down) the displacement, which in turn can prevent damage to the resident wafer 44.

It is further noted that the stack 38 transfers the compressive load exerted by the stop portion 59 through the plurality of wafer support rings 36 without exerting force on the resident wafers 44. The same is true of impact loads: any impact load that is transferred through the stack 38 is not transferred through any of the resident wafers 44.

Figure 14:
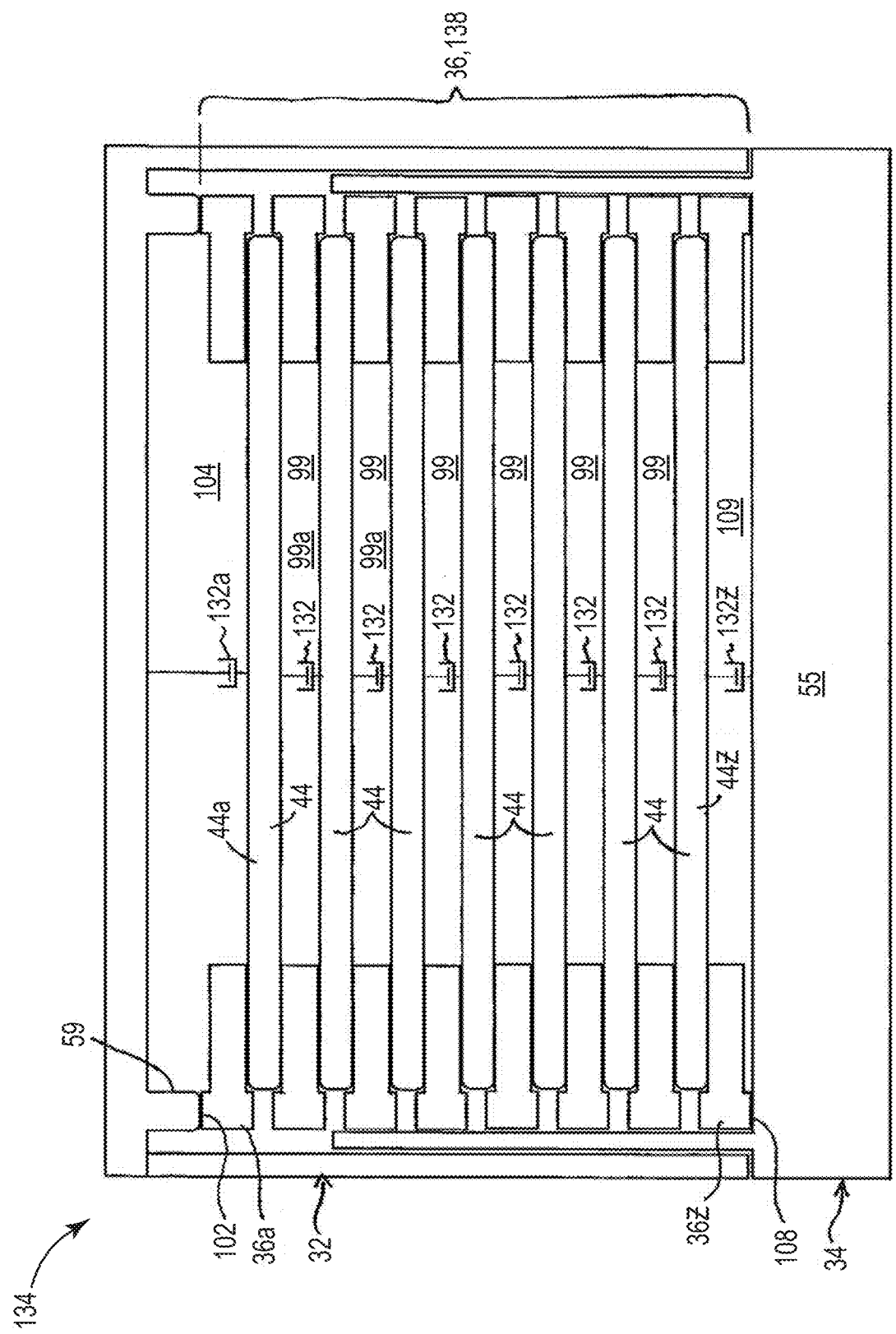
FIG. 14 is a schematic of a wafer shipper depicted as a multiple damper system and utilizing a stack that transfers compression forces to the resident wafers in an embodiment of the disclosure.

Referring to FIG. 14, a wafer shipper 134 is schematically depicted in an embodiment of the disclosure. The wafer shipper 134 includes many of the same components and attributes as the wafer shipper 134 of the FIG. 13 schematic, which are identified by same-numbered numerical references. For the wafer shipper 134, the wafer supports 36 are in contact with both wafers 44 that are adjacent thereto to define a stack 138 that transfers compressive forces through the resident wafers 44. In one embodiment, the stack 138 is not supported on a mounting ring (i.e., there is no proud structure akin to mounting ring 57 that extends upward from the base 55); rather, the lowermost support ring 36z is seated on a flat portion of the base 55, forming the substantially continuous band of contact 108 therebetween. The general principle of limiting wafer deflection due to the dampening provided by the gas within the voids 99 and gas pockets 104, 109 is the same as described attendant to the wafer shipper 130 of FIG. 13.

Figure 15:
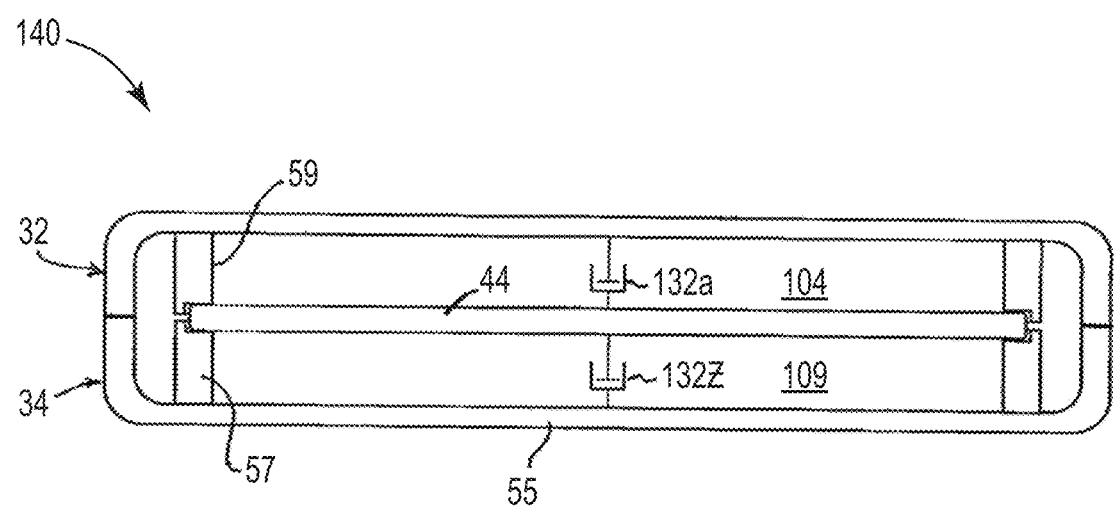
FIG. 15 is a schematic of a single wafer shipper in an embodiment of the disclosure.

Referring to FIG. 15, as single wafer shipper 150 is schematically depicted in an embodiment of the disclosure. The wafer shipper 134 includes some of the same components and attributes as the wafer shipper 134 of the FIG. 13 schematic, which are identified by same-numbered numerical references. Schematically, the wafer shipper 150 is the same as wafer shipper 130 sans the wafer support rings 36 and stack 38. The upper gas pocket 104 and the lower gas pocket 109 operate to counter deflection of the resident wafer, similar to the voids 99 and gas pockets 104, 109 of the wafer shipper 130 schematically depicted in FIG. 13.

Figure 16:
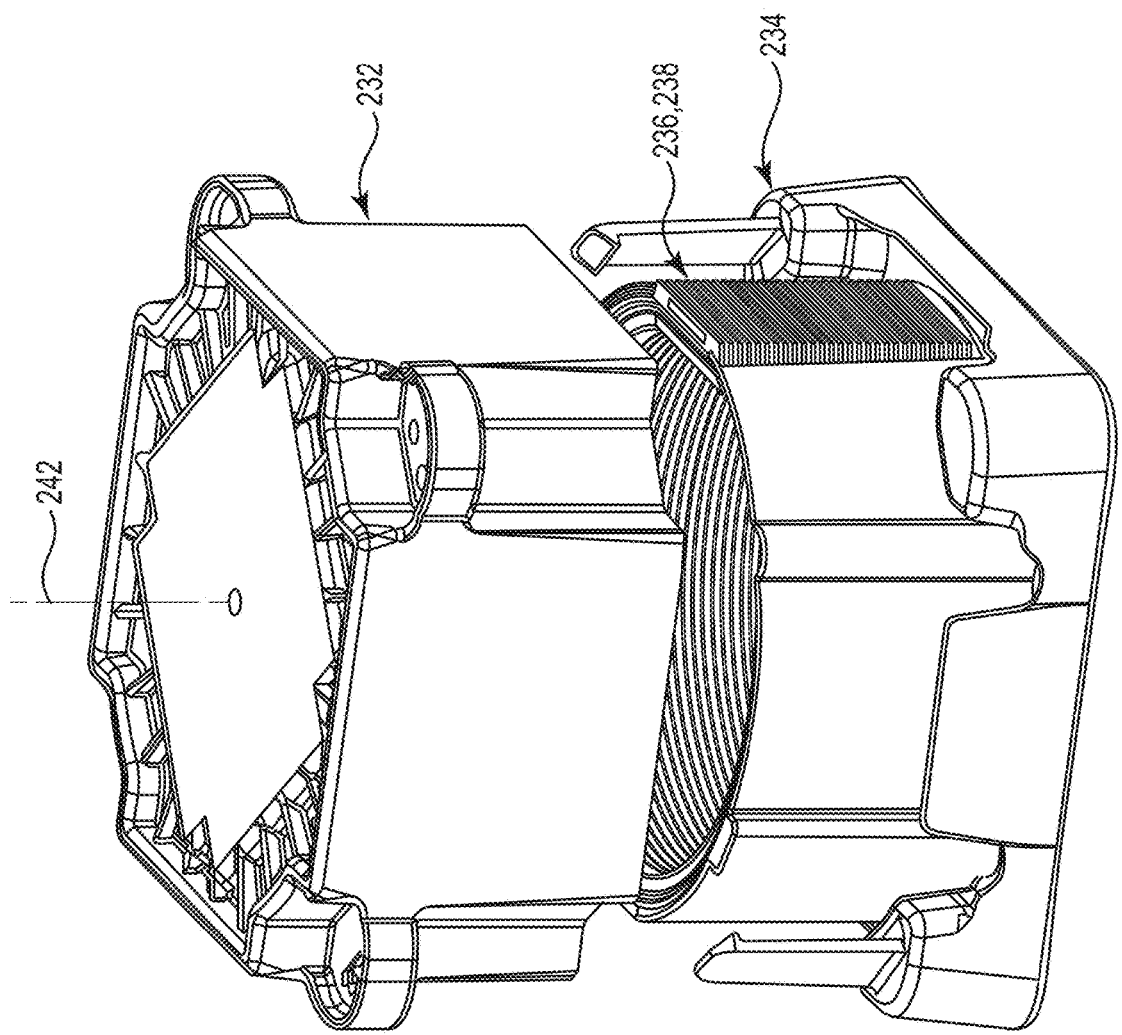
FIG. 16 is a partially exploded view of a wafer shipper in an embodiment of the disclosure.
Figure 17:
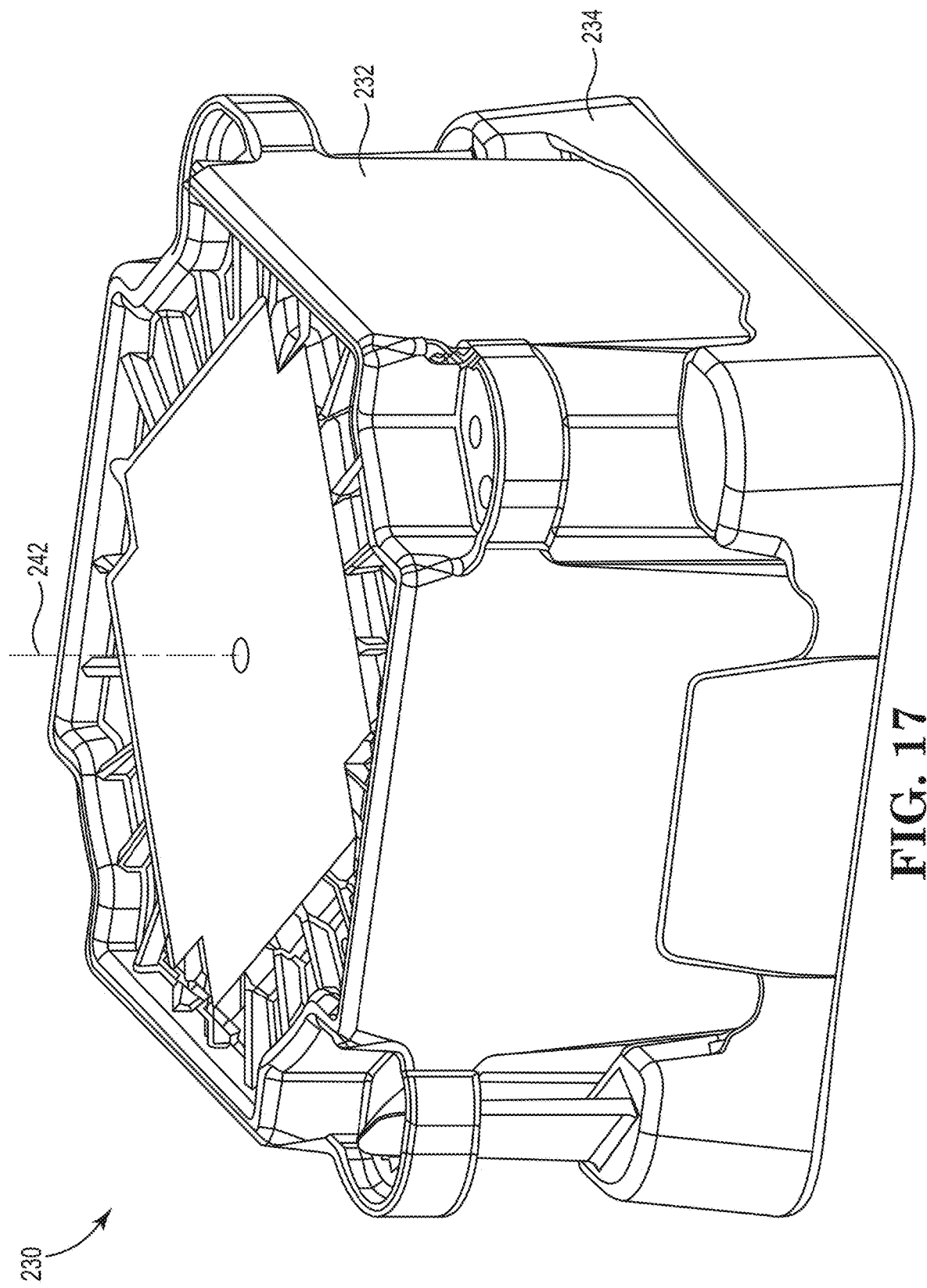
FIG. 17 is an assembled perspective view of the wafer shipper of FIG. 16.

Referring to FIGS. 16 and 17, a wafer shipper 230 is depicted in an embodiment of the disclosure. The wafer shipper 230 includes a cover portion 232 and a receptacle portion 234. A plurality of wafer support rings 236 are disposed in a stack 238 within the wafer shipper 230, the stack 238 being substantially concentric about a mounting axis 242 of the receptacle portion 234. Each wafer support ring 236 is shaped and dimensioned to support a wafer 244 having an outer periphery 246 and a primary wafer flat 248, the primary wafer flat 248 that defining a chord 252 (FIG. 20).

Referring to FIGS. 18 through 21, a wafer support ring 260 of the plurality of wafer support rings 236 is depicted in an embodiment of the disclosure. The wafer support ring 260 defines a central axis 262 and includes a flange portion 264 having a first face 266 and a second face 268, the second face 268 being opposite the first face 266. The wafer support ring 260 further comprises an outer rim portion 272 that protrudes in an axial direction 274 parallel to the central axis 262 from the first face 266 of the flange portion 264 to a distal extremity 275. The first face 266 of the flange portion 264 includes a planar surface portion 276 that is radially inset from and adjacent to the outer rim portion 272.

The wafer support ring 260 further includes a wafer flat support structure 280 that extends radially inward from the flange portion 264. The wafer flat support structure 280 includes a first surface 281 having a planar surface portion 282 that is radially inset from the planar surface portion 276 of the flange portion 264, the planar surface portion 282 of the wafer flat support structure 280 defining a linear edge 284. The linear edge 284 defines a minimum radius Rmin from the central axis 262 of the planar surface portion 282 of the wafer flat support structure 280, the linear edge 284 extending substantially orthogonal to the central axis 262 and substantially perpendicular to the minimum radius Rmin. The wafer support ring 260 further includes a first tab portion 286 that extends radially outward from the outer rim portion 272 and along a first tangential length 288 of the rim portion 272.

In one embodiment, the planar surface portions 276 and 282 define a registration plane 290 for the resident wafer 44. Registration of the wafer 244 against planar surface portions 276 and 282 can provide a substantially continuous band of contact between the wafer 244 and the wafer support ring 260, with beneficial effects as discussed above in relation to the substantially continuous band of contact 48 discussed above. The cover portion 232 can be configured to mate with an uppermost support ring of the stack 238, and the receptacle portion 234 configured to mate with a lowermost support ring of the stack 238, to define a gas pockets akin to gas pockets 104 and 109 of FIG. 13, again with attendant benefits as described above.

In various embodiments, the wafer flat support structure 280 includes a rib 292 that protrudes in an axial direction 294 parallel to the central axis 262, the rib 292 being radially inset from the outer rim portion 272 and radially outset from the planar surface portion 282 of the wafer flat support structure 280. In one embodiment, the rib 292 protrudes from the first face 281 of the wafer flat support structure 280 and in the same axial direction 274 as the outer rim portion 272. In one embodiment, the rib 292 includes a linear portion 296 that extends parallel to the linear edge 284 of the planar surface portion 282 of the wafer flat support structure 280.

In one embodiment, the first face 281 of the wafer flat support structure 280 includes an inclined portion 302 that extends radially inward from the linear edge 284 of the planar surface portion 282 of the wafer flat support structure 280, the inclined portion 302 extending toward the central axis 262 and away from the registration plane 290. Likewise, the first face 266 of the flange portion 264 can include an inclined portion 304 that extends radially inward from the planar surface portion 276 of the flange portion 264, the inclined portion 304 extending toward the central axis 262 and away from the registration plane 290.

In the various embodiments, a junction 306 between the outer rim portion 272 and the planar surface portion 276 of the flange portion 264 defines a radius Rmax relative to the central axis 262 that provides a close tolerance fit with the outer periphery 46 of the resident wafer 44. Likewise, a junction 308 between the linear portion 296 of the rib 292 and the planar surface portion 282 of the wafer flat support structure 280 can provide a close tolerance fit with the primary wafer flat 48 of the resident wafer 44. The planar surface portions 276 and 282 can be dimensioned so as not to encroach on the Fixed Quality Area (FQA) of the resident wafer 44, as stipulated by ISTA-2A when the resident wafer 44 is registered within the wafer support ring 260.

Figure 22:
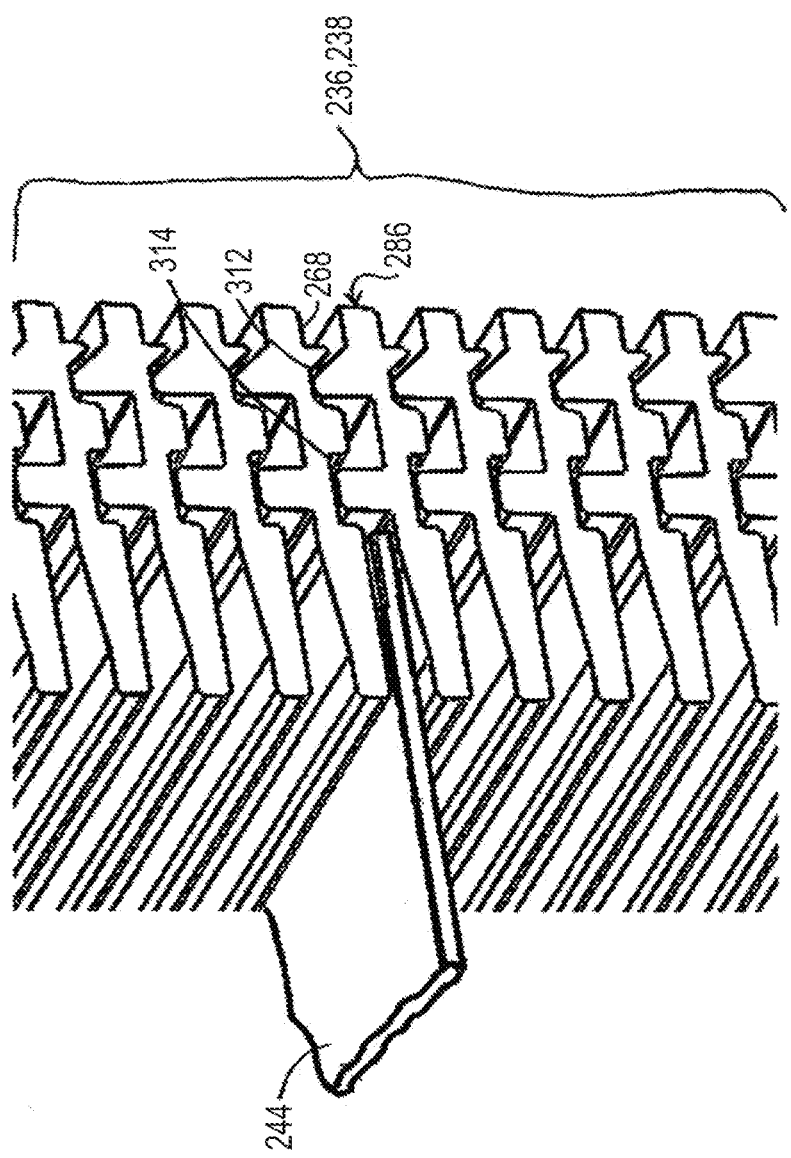
FIG. 22 is a partial sectional view of a stack of wafer support rings with an example resident wafer in an embodiment of the disclosure.

Referring to FIG. 22, a partial sectional view of the stack 238 is depicted in an embodiment of the disclosure. One resident wafer 44 is depicted for illustrative purposes. In the depicted embodiment, the second face 268 of each wafer support ring 260 of the plurality of wafer support rings 236 includes structure defining a first circular groove 312, within which the outer rim portion 272 of an adjacent one of the plurality of wafer support rings 236 is seated. In one embodiment, the second face 268 also includes structure defining a second groove 314, the second groove 314 being dimensioned and shaped to register the rib of the adjacent of the plurality of wafer support rings 236.

Functionally, the stack 238 captures the resident wafer(s) 44 and limits axial movement thereof during an impact episode. The close tolerance fits between the junction 306 and the outer periphery 46 and between the junction 308 and the linear portion 296 of the rib 292 limits lateral movement of the resident wafer 44 during an impact episode. The grooves 312 and 314 further prevent the wafer from "jumping" the outer rim portions 272 and the ribs 292, respectively, and becoming damaged because of entrapment between the outer rim portion 272 and/or the rib 292 and the second face 268 of the adjacent one of the plurality of wafer support rings 236. The registration of the resident wafer 44 and the planar surface portions 276 and 282 further provides a flow restriction between the resident wafer 44 and the wafer support ring 260. During an impact episode, the flow restriction can act as a damper between adjacent "pockets" defined between the plurality of wafer support rings 236 and the resident wafer(s) 44, due to the effect of the air captured and slowly released from the pocket. The damping effect further cushions the resident wafer(s) 44 from impact damage.

Figure 23:
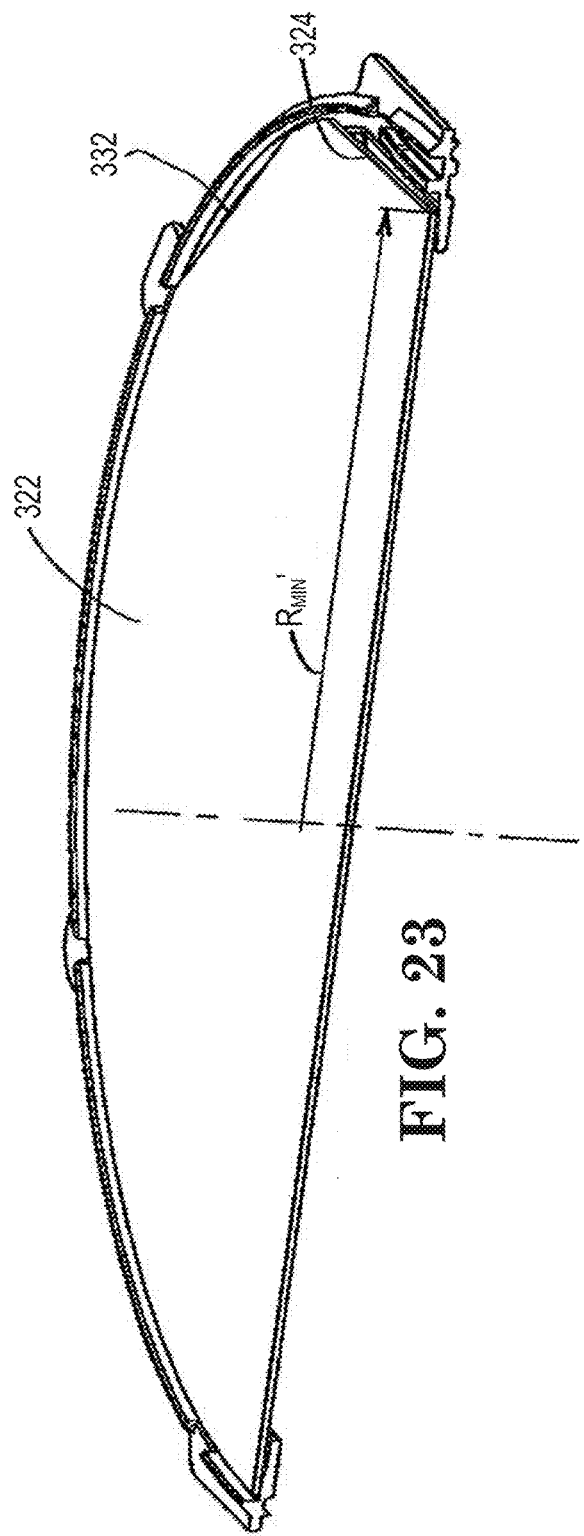
FIG. 23 is a sectional view of the wafer support ring of FIG. 18 with a resident wafer having a longer chord length in an embodiment of the disclosure.
Figure 24:
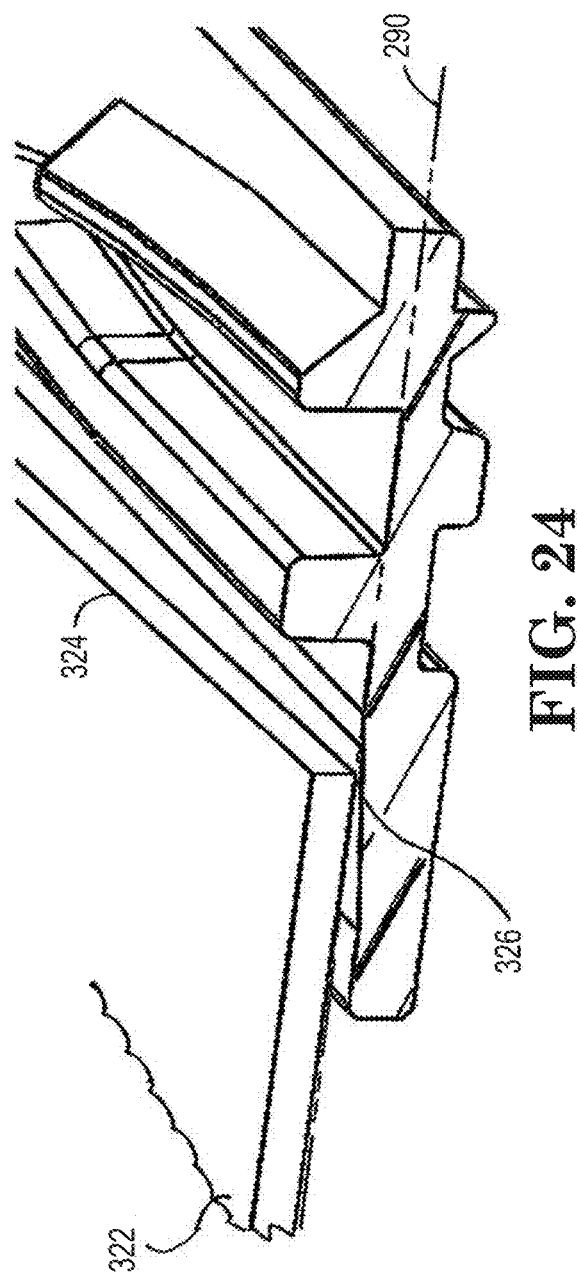
FIG. 24 is an enlarged, partial view of FIG. 23.

Referring to FIGS. 23 and 24, a resident wafer 322 having a longer chord 324 than the chord 252 of the resident wafer 44 is depicted in the wafer support ring 260 in an embodiment of the disclosure. It is noted that, in a non-limiting example, that standard 150 mm wafers can have primary flats 48 with chords 252 of 47.5 mm and 57.5 mm. The longer length of the chord 324 reduces a minimum radius Rmin' between the central axis 262 and the chord 252. In some embodiments, the wafer support ring 260 can be modified by disposing the rib 292 closer to the central axis 262. In other embodiments, such as depicted in FIGS. 23 and 24, the primary flat is left suspended over the inclined portion 302 of the wafer flat support structure 280. In one embodiment, an axial gap 326 is defined between the primary flat 48 and the inclined portion 302 that is on the order of 0.05 mm when the resident wafer 322 is registered within the wafer support ring 260.

Functionally, the relatively small dimension of the gap 326 still limits axial deflection of the primary flat 48 during an impact episode. The relatively small dimension of the gap 326 can still provide some restriction of flow, thereby facilitating the cushioning effect of the "pockets" between the resident wafers 322.

It is further noted that certain wafer types can include a secondary wafer flat 332 (FIG. 23). The secondary wafer flat 332 is typically an identification feature, wherein the position relative to the primary flat 48 depends on some characteristic of the resident wafer 44, 322. For example, the secondary flat 332 can be of 37.5 mm length and can be centered at angles of 45°, 90°, 135°, and 180° from the center of the primary flat 48. Some wafers have no secondary flat at all. Accordingly, the secondary flat 332 can appear in many different positions relative to the primary flat 48.

Figure 25:
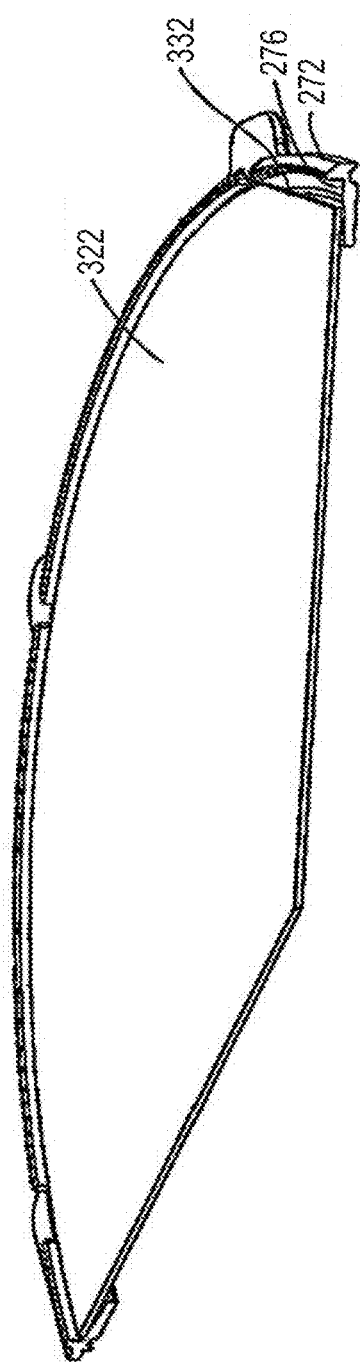
FIG. 25 is a partial sectional view of the wafer support ring of FIG. 18 with a resident wafer in an embodiment of the disclosure.
Figure 26:
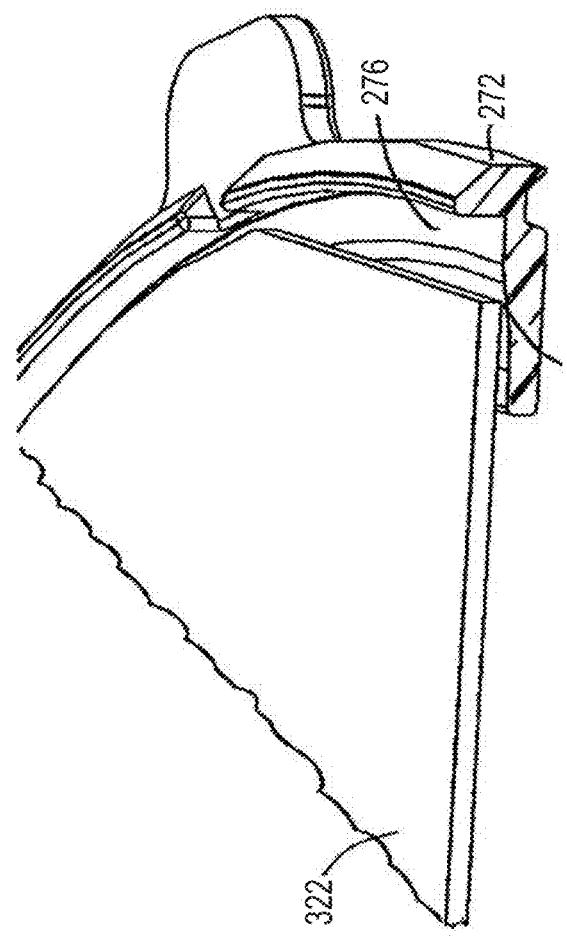
FIG. 26 is an enlarged, partial view of FIG. 25.

Referring to FIGS. 25 and 26, an example and non-limiting embodiment depicting the secondary flat 332 as located within the wafer support ring 260 is depicted. For the secondary flat 332 of 37.5 mm chord length, a maximum gap 334 over the inclined portion 304 of the flange portion 264 is on the order of 0.1 mm. The relatively small dimension of the maximum gap 334 still limits axial deflection of the primary flat 48 during an impact episode. The relatively small dimension of the maximum gap 334 can also still provide some restriction of flow, thereby facilitating the cushioning effect of the "pockets" between the resident wafers 322.

Referring again to FIGS. 18 through 21, the wafer support ring 260 can also include a second tab portion 362 extending radially outward from and along a second tangential length 364 of the rim portion 272, the second tangential length 364 being of a different dimension than the first tangential length 288 of the first tab portion 286. The first tab portion 286 can be diametrically opposed to the second tab portion 362.

The wafer support ring 260 can also include a third tab portion 366 extending radially outward from and along a third tangential length 368 of the rim portion 272. The third tangential length can be of a different dimension than the first tangential length 288 and the second tangential length 364. In one embodiment, the first tab portion 286, the second tab portion 362, and the third tab portion 366 are asymmetrically disposed about the central axis 262.

Figure 18:
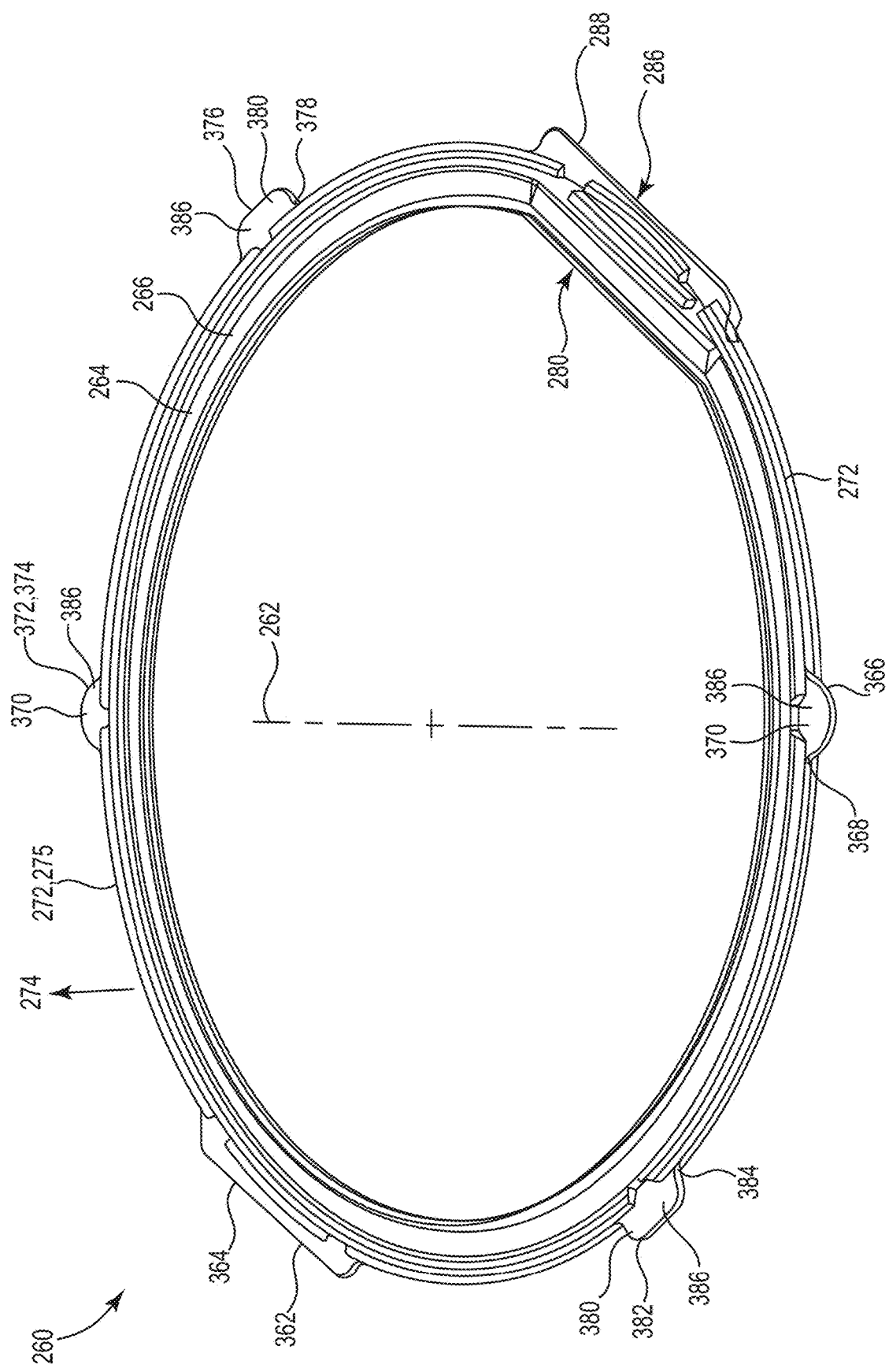
FIG. 18 is a perspective view of a wafer support ring in an embodiment of the disclosure.
Figure 19:
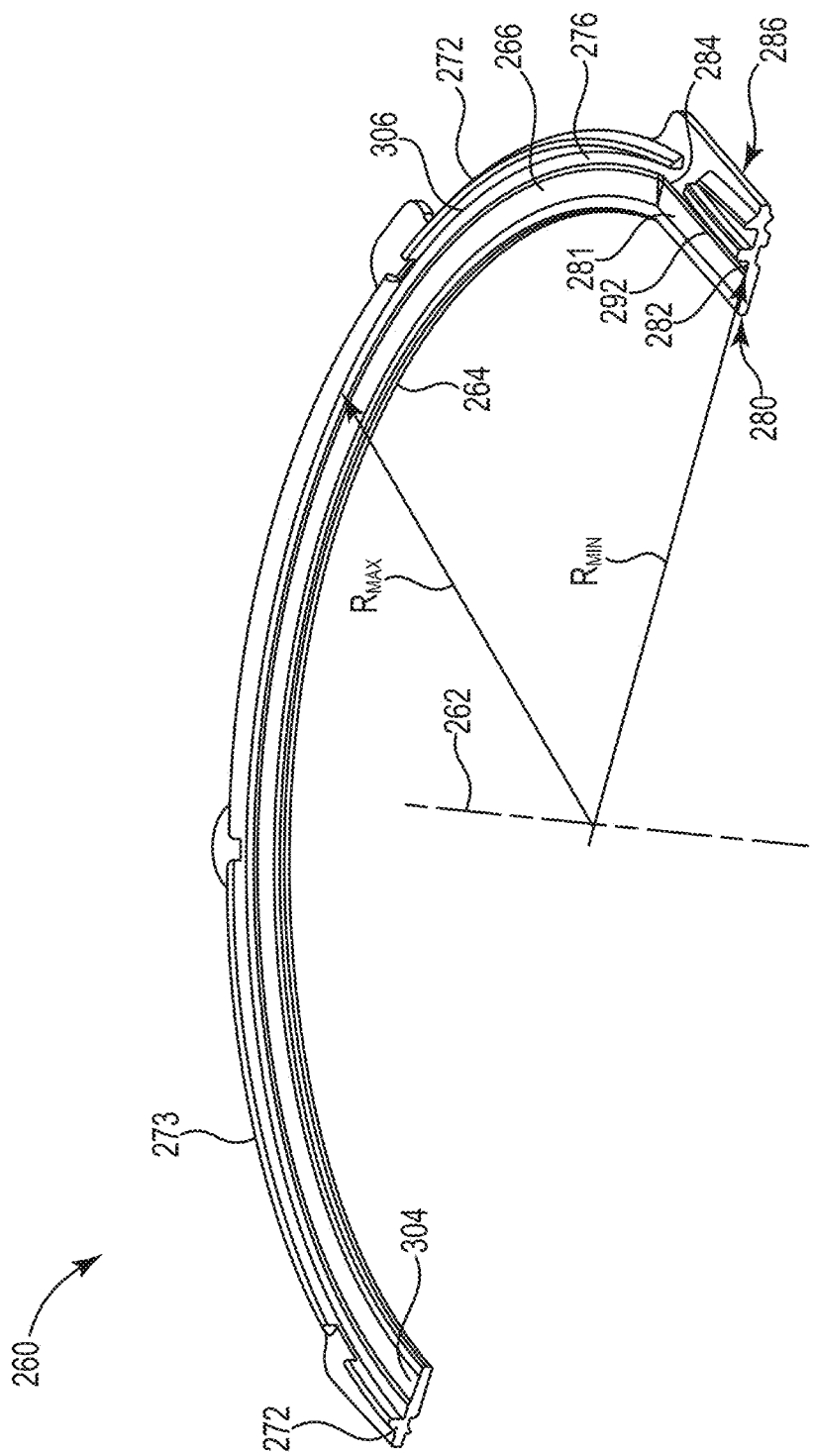
FIG. 19 is a sectional view of the wafer support ring of FIG. 18.

In various embodiments, the wafer support ring 260 includes a fourth tab portion 372 extending radially outward from and along a fourth tangential length 374 of the rim portion 272, the fourth tab portion 372 being diametrically opposed to the third tab portion 366 about the central axis 262. In one embodiment, the third tab portion 366 and the fourth tab portion 372 each define a first plan view profile 370 of substantially same shape and substantially same dimensions (e.g., substantially the shape of a semi-circle, as depicted in FIG. 18).

In some embodiments, the wafer support ring 260 includes a fifth tab portion 376 extending radially outward from and along a fifth tangential length 378 of the rim portion 272. In some embodiments, the wafer support ring 260 includes a sixth tab portion 382 extending radially outward from and along a sixth tangential length 384 of the rim portion 272, sixth tab portion 382 being diametrically opposed to the fifth tab portion 376 about the central axis 262. In one embodiment, the fifth tab portion 376 and the sixth tab portion 382 each define a second plan view profile 380 of substantially same shape and substantially same dimensions, the second plan view profile 380 being at least one of different shape and different dimensions than the first plan view profile 370.

In one embodiment, the third tab portion 366, the fourth tab portion 372, the fifth tab portion 376, and the sixth tab portion 382 each include a flat surface 386 for engagement with a vacuum pad (not depicted). Also, in the depicted embodiments, the flat surfaces 386 extend radially inward through the outer rim portion 272, thereby providing more area for engagement of the vacuum pad.

The outer rim portion 272 is depicted as being discontinuous at the various tab portions 286, 362, 366, 372, 376, and 382 because of the flat surfaces 386 extending through the outer rim portion 272. In an alternative embodiment, the distal edge 275 of the outer rim portion is continuous and defines a plane (not depicted), so that, when the wafer support rings 236 are stacked as depicted in FIG. 22, a substantially continuous line or band of contact is defined between adjacent wafer support rings, akin to the substantially continuous band of contact 94 between wafer support rings 36 of FIG. 5, with benefits as described herein.

Figure 27:
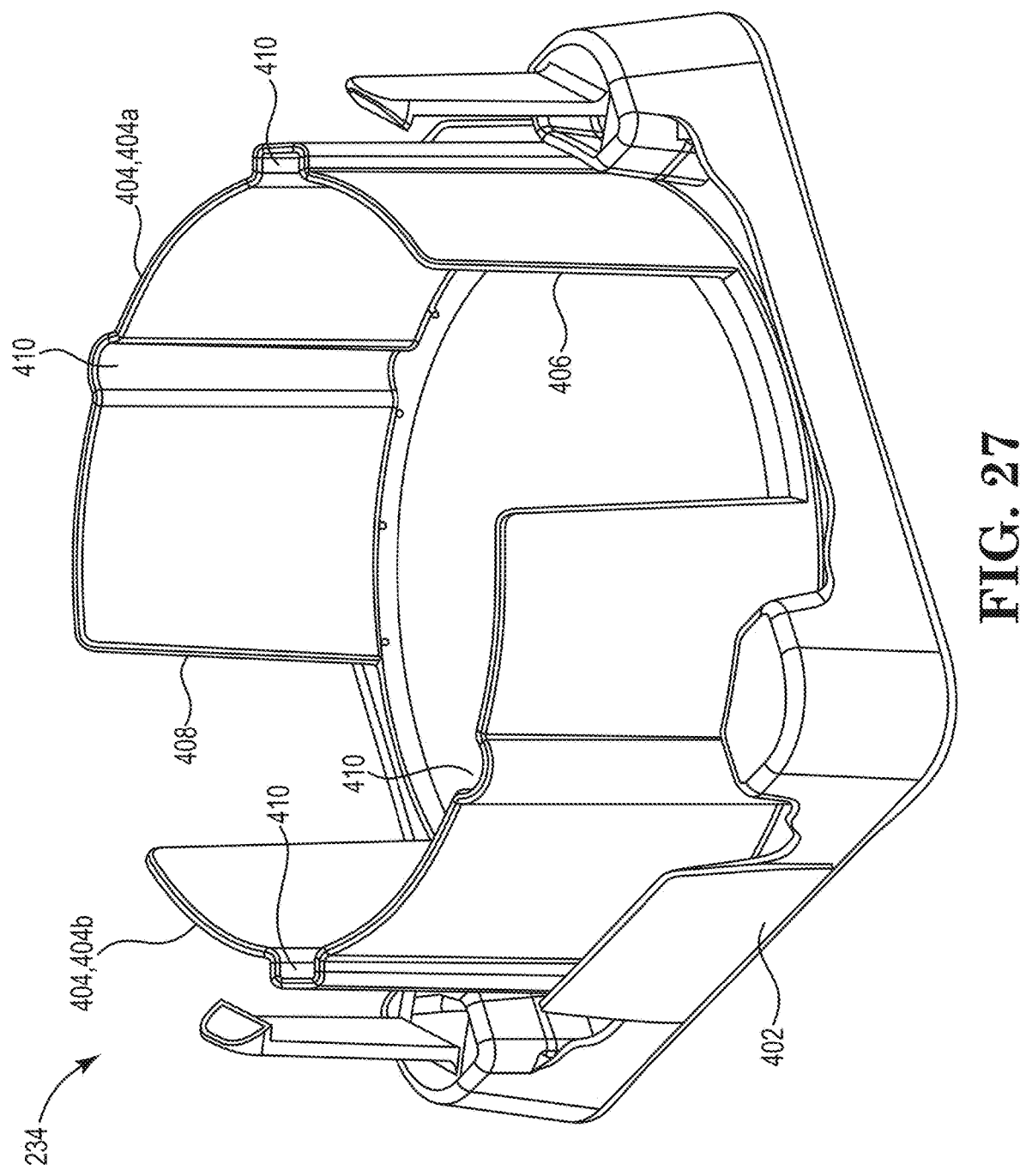
FIG. 27 is a perspective view of a receptacle of the shipper of FIGS. 16 and 17 in an embodiment of the disclosure.
Figure 28:
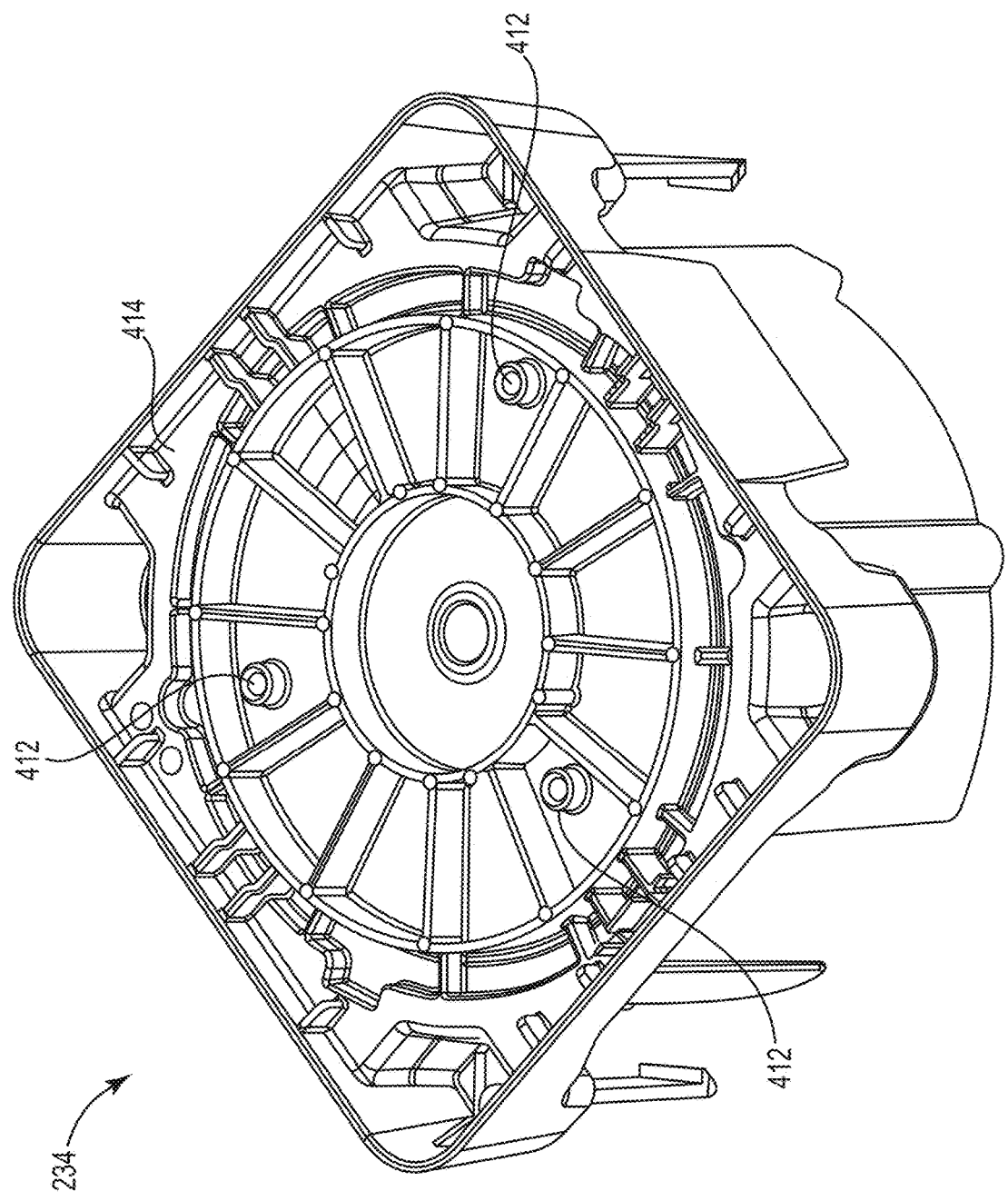
FIG. 28 is a bottom perspective view of the receptacle of FIG. 27.

Referring to FIGS. 27 and 28, the receptacle portion 234 of the wafer shipper 230 is depicted in an embodiment of the disclosure. The receptacle portion 234 includes a base portion 202 and at least one arcuate wall portion 404 extending from the base portion, the at least one arcuate wall 404 portion being centered about and substantially parallel to the mounting axis 42, the at least one arcuate wall portion 404 defining a first lateral opening 406 dimensioned to receive the first tab portion 286 of the wafer support ring 260. Alternatively, the at least one arcuate wall portion 404 can define a first lateral recess (not depicted) to receive the first tab portion 286.

In the depicted embodiment, the at least one arcuate wall portion 404 comprises a pair of opposed arcuate wall portions 404a and 404b, the opposed arcuate wall portions 404a and 404b being centered about the mounting axis 42, the pair of opposed arcuate wall portions 404a and 404b defining the first lateral opening 406 and a second lateral opening 408 therebetween. The second lateral opening 408 is dimensioned to accept the second tab portion 162. Alternatively, the at least one arcuate wall portion 404 can define a second lateral recess (not depicted) to receive the second tab portion 286.

The at least one arcuate wall portion 404 can also include lateral recesses 410 that are located and dimensioned to receive the various tab portions of the wafer support ring. Alternatively, the at least one arcuate wall portion 404 can define lateral openings instead of lateral recesses located and dimensioned to accommodate the various tab portions of the wafer support ring 260.

Functionally, the various tab portions rotationally fix the wafer support ring 260 within the receptacle 234 and can be arranged to assure that the wafer support ring 260 is not installed upside down in the receptacle 234.

In one embodiment, the base portion 402 includes a plurality of bosses 412 that are disposed on an underside 414 of the base portion 402. The bosses 412 can be asymmetric with respect to their radial location from the mounting axis 42, their angular distribution about the mounting axis 42, and/or their size relative to each other. The position of the bosses can be sensed external equipment, for example by limit switches or other proximity switches, to confirm proper orientation of the shipper 230.

The various embodiments described and depicted herein are suitable for, but not limited to, containment and shipping of 150 mm, 200 mm, 300 mm, and 450 mm wafers.

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant art will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can utilize fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can include a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A wafer shipping system, comprising:
 a plurality of wafer support rings, each wafer support ring being concentric about a central axis and including
  a ridge portion that protrudes in an axial direction parallel to said central axis,
  a planar surface portion extending away from the ridge portion in a direction toward said central axis, the planar surface portion defining a registration plane configured to support a portion of a wafer thereon,
  a flange portion concentric about a central axis and extending inwardly and away from the registration plane of the planar surface portion, said flange portion including a first axial face and a second axial face, said second axial face being opposite said first axial face, and
  a channel defined on said second axial face of the flange portion, said channel including an inner radial wall defining an inner radius relative to said central axis and an outer radial wall defining an outer radius relative to said central axis; and
 a wafer disposed on the registration plane of the planar surface of the second support ring,
 wherein a first wafer support ring of said plurality of wafer support rings is stacked atop a second wafer support ring of said plurality of wafer support rings such that a distal edge of said ridge portion of said second wafer support ring is registered within said channel of said first wafer support ring, the first and second wafer support rings defining a gap between the second axial face of the first wafer support ring and a planar surface portion of the second wafer support ring,
 wherein the gap defined between the second axial face of the first wafer support ring and a planar surface portion of the second wafer support ring has an axial dimension that is greater than an axial dimension of the wafer when the ridge portion is registered in the channel, the gap being configured for containing the wafer so that an axial force exerted on said first wafer support ring is transferred to said second wafer support ring without transferring force to the wafer, and
 wherein a void is defined between an upper surface of the wafer and a lower surface of the second axial face of the first wafer support ring.

2. The wafer shipping system of claim 1, wherein said channel is continuous.

3. The wafer shipping system of claim 2, wherein said ridge portion is continuous and surrounds said gap defined between said first and second wafer support rings.

4. The wafer shipping system of claim 3, wherein a substantially continuous band of contact is defined between said distal edge of said ridge portion and said channel.

5. The wafer shipping system of claim 4, wherein said first axial face of said flange portion of each of said plurality of wafer support rings includes a planar surface portion that is radially inset from and adjacent to said ridge portion, said planar surface portion defining a registration plane for a wafer.

6. The wafer shipping system of claim 5, wherein:
 said first wafer support ring is configured for engaging a first wafer to provide a substantially continuous band of contact between said first wafer and said planar surface portion of said first wafer support ring; and
 said second wafer support ring is configured for engaging a second wafer to provide a substantially continuous band of contact between said second wafer and said planar surface portion of said second wafer support ring,
 whereby said first wafer support ring and said second wafer support ring are configured for defining an enclosed void when said first wafer is disposed in said first wafer support ring and said second wafer is disposed in said second wafer supportring.

7. The wafer shipping system of claim 1, wherein a wafer is contained in said gap.

8. The wafer shipping system of claim 1, comprising:
 a receptacle portion; and
 a cover portion configured to provide closure of said receptacle portion,
 wherein said plurality of wafer support rings are arranged in a stack, said stack being disposed in said receptacle portion, said cover portion contacting said stack when said cover portion is in closure with said receptacle portion to secure said stack between said cover portion and said receptacle portion.

9. The wafer shipping system of claim 5, comprising:
 a receptacle portion; and
 a cover portion configured to provide closure of said receptacle portion,
 wherein said plurality of wafer support rings are arranged in a stack, said stack being seated on a base portion of said receptacle portion, said cover portion contacting said stack when said cover portion is in closure with said receptacle portion to secure said stack between said cover portion and said base portion, and
 wherein said stack includes a lowermost wafer support ring that engages said base portion of said receptacle portion to define a substantially continuous band of contact therebetween, said lowermost wafer support ring being configured for engaging a lowermost wafer to provide a substantially continuous band of contact between said lowermost wafer and said planar surface portion of said lowermost wafer support ring,
 whereby said lowermost wafer support ring and said base portion are configured for defining an enclosed gas pocket when lowermost wafer is disposed in said lowermost wafer support ring.

10. The wafer shipping system of claim 9, wherein:
 said cover portion includes a stop portion that extends axially into said cover portion, said stop portion defining a continuous axial face;
 said stack includes an uppermost wafer support ring that engages said continuous axial face of said stop portion to define a substantially continuous band of contact therebetween, said uppermost wafer support ring being configured for engaging an uppermost wafer to provide a substantially continuous band of contact between said uppermost wafer and said planar surface portion of said uppermost wafer support ring,
 whereby said uppermost wafer support ring and said cover portion are configured for defining an enclosed gas pocket when said uppermost wafer is disposed in said uppermost wafer support ring.

11. The wafer shipping system of claim 10, wherein said stop portion depends from a top portion of said cover portion, said stop portion including a plurality of radially extending ribs that extend radially outward from proximate a central axis of said top portion.

12. The wafer shipping system of claim 9, wherein:
said cover portion includes a stop portion that extends axially into said cover portion, said stop portion defining a continuous axial face;
said stack includes an uppermost wafer support ring that engages said continuous axial face of said stop portion to define a substantially continuous band of contact therebetween,
said stack includes an adjacent wafer support ring in contact with said uppermost wafer support ring, said adjacent wafer support ring being configured for engaging an uppermost wafer to provide a substantially continuous band of contact between said uppermost wafer and said planar surface portion of said adjacent wafer support ring, whereby said uppermost wafer support, said adjacent wafer support ring, and said cover portion are configured for defining an enclosed gas pocket when an uppermost wafer is disposed in said adjacent wafer support ring.

13. The wafer support system of claim 1, wherein said gap is configured to accommodate a 300 mm wafer.

* * * * *